(12) United States Patent
Kang

(10) Patent No.: US 9,265,162 B2
(45) Date of Patent: Feb. 16, 2016

(54) MANUAL UNDERGROUND LAYING TYPE ELECTRIC EQUIPMENT CONTAINER SYSTEM

(71) Applicants: Eun-jin Kang, Seoul (KR); Jang-hyuk Lee, Seongnam-si (KR)

(72) Inventor: Eun-jin Kang, Seoul (KR)

(73) Assignees: Eun-Jin Kang, Seoul (KR); Jang-Hyuk Lee, Seoul (KR)

( * ) Notice: Subject to any disclaimer, the term of this patent is extended or adjusted under 35 U.S.C. 154(b) by 0 days.

(21) Appl. No.: 14/380,548

(22) PCT Filed: Feb. 20, 2013

(86) PCT No.: PCT/KR2013/001350
§ 371 (c)(1),
(2) Date: Aug. 22, 2014

(87) PCT Pub. No.: WO2013/125862
PCT Pub. Date: Aug. 29, 2013

(65) Prior Publication Data
US 2015/0027774 A1    Jan. 29, 2015

(30) Foreign Application Priority Data

Feb. 23, 2012  (KR) ........................ 10-2012-0018701
Nov. 28, 2012  (KR) ........................ 10-2012-0136526

(51) Int. Cl.
*H02G 9/00*       (2006.01)
*H01H 9/02*       (2006.01)
(Continued)

(52) U.S. Cl.
CPC ................ *H05K 5/0004* (2013.01); *H02B 1/28* (2013.01); *H02B 7/08* (2013.01); *H02G 9/10* (2013.01); *H05K 5/0226* (2013.01); *H05K 5/0239* (2013.01); *H02B 1/505* (2013.01)

(58) Field of Classification Search
CPC .............. H02B 7/00; H02B 7/06; H02B 7/08; H02B 1/44; H02B 1/301
USPC ............. 174/37, 38, 39, 50.52; 361/659, 660, 361/666, 610; 220/240, 484; 52/20, 21, 52/169.14
See application file for complete search history.

(56) References Cited

U.S. PATENT DOCUMENTS 3,858,755 A * 1/1975 Tellen ................ E02D 29/1427
                                                      220/284
4,310,817 A * 1/1982 McNiel ................ B60K 28/14
                                                      180/284
(Continued)

FOREIGN PATENT DOCUMENTS

JP      07-298428 A    11/1995
KR      10-0443588      8/2004
(Continued)

OTHER PUBLICATIONS

International Search Report for PCT/KR2013/001350 mailed on Jun. 27, 2013 and its translation thereof.
(Continued)

*Primary Examiner* — Chau N Nguyen
*Assistant Examiner* — Roshn Varghese
(74) *Attorney, Agent, or Firm* — Ladas & Parry, LLP

(57) ABSTRACT

Provided is an underground laid electric equipment container system including: a box that is laid underground in the form of an opened manhole; a box holder that comprises a horizontal frame that is coupled to an upper surface of the buried box in an sealed state and an inner vertical frame that is upwardly bent from an inner edge of the horizontal frame; a cover, to which a waterproof band covering the entire upper portion of the inner vertical frame is attached, wherein coupling devices with an upper surface of the horizontal fame that allow adhesion between the upper portion of the inner vertical frame and the waterproof band are installed on the cover; and an electric equipment box that is disposed in sealed inner space of the buried box that is formed as the upper portion of the inner vertical frame and the waterproof band are adhered to each other by user's manipulation.

10 Claims, 19 Drawing Sheets

(51) Int. Cl.
*H01H 13/04* (2006.01)
*H01H 19/04* (2006.01)
*H01H 21/04* (2006.01)
*H01H 23/04* (2006.01)
*H01R 13/46* (2006.01)
*H01L 23/02* (2006.01)
*H02B 1/00* (2006.01)
*H02B 1/04* (2006.01)
*H02B 1/26* (2006.01)
*H02G 3/08* (2006.01)
*B65D 88/76* (2006.01)
*E02D 29/14* (2006.01)
*H05K 5/00* (2006.01)
*H02B 1/28* (2006.01)
*H02B 7/08* (2006.01)
*H02G 9/10* (2006.01)
*H05K 5/02* (2006.01)
*H02B 1/50* (2006.01)

(56) References Cited

U.S. PATENT DOCUMENTS

| | | | | |
|---|---|---|---|---|
| 4,872,575 | A * | 10/1989 | Kobilan | H02G 9/10 220/23.86 |
| 5,192,934 | A * | 3/1993 | Milianowicz | H01H 71/32 335/167 |
| 5,507,590 | A * | 4/1996 | Argandona | E02D 29/1463 52/20 |
| 5,636,101 | A * | 6/1997 | Bonsall | G06F 1/181 361/679.27 |
| 5,855,290 | A * | 1/1999 | Fahey | B65D 85/68 220/4.02 |
| 6,229,707 | B1 * | 5/2001 | Keenan | H02B 7/06 361/601 |
| 6,316,728 | B1 * | 11/2001 | Hoover | H04Q 1/025 174/135 |
| 6,772,566 | B1 * | 8/2004 | Machledt | H02G 9/10 52/169.1 |
| 2009/0072685 | A1 * | 3/2009 | Bundza | H05K 7/2059 312/236 |

FOREIGN PATENT DOCUMENTS

| | | |
|---|---|---|
| KR | 10-0947101 | 3/2010 |
| KR | 10-2010-0064093 A | 6/2010 |
| KR | 10-0978120 B1 | 8/2010 |
| KR | 10-1018366 B1 | 3/2011 |
| KR | 10-2011-0126905 A | 11/2011 |

OTHER PUBLICATIONS

Written Opinion of the International Searching Authority for PCT/KR2013/001350 mailed on Jun. 27, 2013 and its translation thereof.

\* cited by examiner

MANUAL UNDERGROUND LAYING TYPE ELECTRIC EQUIPMENT CONTAINER SYSTEM

CROSS-REFERENCE TO RELATED APPLICATIONS

This application is the U.S. National Stage of International Patent Application No. PCT/KR2013/001350 filed on Feb. 20, 2013, which claims priority to Korean Patent Application Nos. 10-2012-0018701, filed on Feb. 23, 2012, and 10-2012-0136526 filed on Nov. 28, 2012, the disclosures of which are hereby incorporated by reference in their entireties.

TECHNICAL FIELD

The present invention relates to a container system in which at least one electric equipment may be embedded, and more particularly, to an electric equipment container system which may be manually laid underground.

BACKGROUND ART

According to the conventional art, electric equipment such as an outdoor transformer, an outdoor communication equipment, or a streetlight panel board are installed at an upper portion of a large-sized ground facility such as an electric pole, and thus a person who manages the electric equipment has to go up the electric pole for maintenance and repair of the electric equipment, and this maintenance and repair of the electric equipment is complicated and dangerous. Also, according to the rapid industrialization of the modern society, the demand of electric equipment has exploded so that many facilities related to electric equipment, such as electric poles, have been introduced in many places in the city. As a result, the facilities related to electric equipment have been factors that ruin the appearance of the city and hinder the efficient use of city space, and threaten safety of citizens.

Korean Patent No. 0947101 and Korean Utility Model No. 0443588 disclose an underground laying type electric equipment container system for solving the problems as described above. An underground laying type electric equipment container system according to the conventional art is an automatic system that uses a power unit such as a motor in order to move an electric equipment, which is located underground, to the ground. However, the manufacturing costs of the underground laying type electric equipment container system are high and thus it is difficult to widely use the same, and also, due to the volume of the underground laying type electric equipment container system, it is difficult to move and install the system.

DISCLOSURE OF THE INVENTION

Technical Problem

The present invention provides an underground laying type electric equipment container system having a structure in which inner space of a buried box which is laid underground may be sealed by using just a human strength of a user and an electric equipment box may be moved into the sealed inner space of the buried box at the same time. The technical objective to be achieved by the present embodiment is not limited to the technical objectives described above, and there may be also other technical objectives.

Technical Solution

According to an aspect of the present invention, there is provided an underground laid electric equipment container system, including: a buried box that is laid underground in the form of a manhole such that omni-directional lateral sides and an underside of the buried box are sealed and a portion of an upper surface of the buried box is opened; a box holder that includes a horizontal frame that is coupled to the upper surface of the buried box in an sealed state and an inner vertical frame that is upwardly bent from an inner edge of the horizontal frame; a cover, to which a waterproof band covering the entire upper portion of the inner vertical frame is attached, wherein coupling devices with an upper surface of the horizontal fame that allow adhesion between the upper portion of the inner vertical frame and the waterproof band are installed on the cover; and an electric equipment box that is disposed in sealed inner space of the buried box that is formed as the upper portion of the inner vertical frame and the waterproof band are adhered to each other by user's manipulation.

Some of the coupling devices of the upper surface of the horizontal frame and the cover may be coupled or separated by user's manipulation, and while some of the coupling devices are separated, the cover may be rotatable with respect to other coupling devices, as an axis of rotation, from among the coupling devices, by user's manipulation. The sealed inner space of the buried box may be formed as the waterproof band is adhered to an upper portion of the horizontal frame by rotation of the cover according to user's manipulation.

The electric equipment box may be attached to a lower surface of the cover and moved as a single body with the cover. Some of the coupling devices of the upper surface of the horizontal frame and the cover may be coupled or separated by user's manipulation, and while some of the coupling devices are separated, the cover may be rotatable with respect to other coupling devices from among the coupling devices, as an axis of rotation, by user's manipulation, and the electric equipment box may be moved out of the buried box as the cover is separated from the upper surface of the inner vertical frame of the box holder by rotation of the cover according to user's manipulation, and at the same time, the electric equipment box may rotate as a single body with the cover.

An electric equipment including at least one component whose performance changes according to various directions of Earth's gravitational force may be embedded in the electric equipment box, and a user interface panel of the electric equipment may be accessible by opening an upper surface of the electric equipment box that is temporarily attached to the lower surface of the cover. Some of the coupling devices of the electric equipment box and the cover may be coupled or separated by user's manipulation, and while some of the coupling devices are separated, the electric equipment box may be rotatable with respect to other coupling devices from among the coupling devices of the electric equipment box and the cover, as an axis of rotation, by user's manipulation, and the upper surface of the electric equipment box may be separated from the lower surface of the cover by rotation of the electric equipment box according to user's manipulation, and at the same time, the upper surface of the electric equipment box may be opened.

An assistant device may be installed between the box holder and the cover to increase a human strength of the user that acts on the cover to rotate the cover. The assistant device may be a gas spring. The box holder may further include an outer vertical frame that is upwardly bent from an outer edge of the horizontal frame, and the underground laying type electric equipment container system may further include: a support that is attached to an inner portion of the outer vertical frame at a predetermined depth from an upper portion of the outer vertical frame; and an upper cover that is mounted to the support.

Advantageous Effects

An underground laying type electric equipment container system having a structure in which inner space of a buried box which is laid underground may be sealed by using just a human strength of a user and an electric equipment box may be moved into the sealed inner space of the buried box at the same time, thereby providing a manual underground laying type electric equipment container system. As the electric equipment which has been on the ground may be manually moved into the sealed inner space of the buried box that is laid underground, facilities related to the electric equipment such as electric poles may be removed from the ground, and accordingly, the appearance of the city is improved, city space may be efficiently used, and safety is ensured as the danger of conduction of the facilities is not present. Since the manual underground laying type electric container system is provided, multiple devices such as a power unit and a controller of the power unit which are needed in the conventional automatic underground laying type electric equipment container system are no longer needed, and thus, the manufacturing costs and size of the underground laying type electric equipment container system may be significantly reduced.

MODE OF THE INVENTION

Hereinafter, embodiments of the present invention will be described in detail with reference to the drawings. If water penetrates into an electric equipment such as an outdoor transformer, an outdoor communication equipment, a streetlight panel board, or a traffic light controller, the electric equipment may get out of order due to, for example, electric leakage. A unit for preventing penetration of rain water or the like, for example, an umbrella-shaped dome, is covered over the electric equipment that is installed outdoor. The embodiments of the present invention are characterized by a system whereby an electric equipment may be manually laid underground while preventing penetration of rain water etc. into the electric equipment. Thus, detailed description of structure and operation of the electric equipment that are well-known in the art will be omitted.

Figure 1:
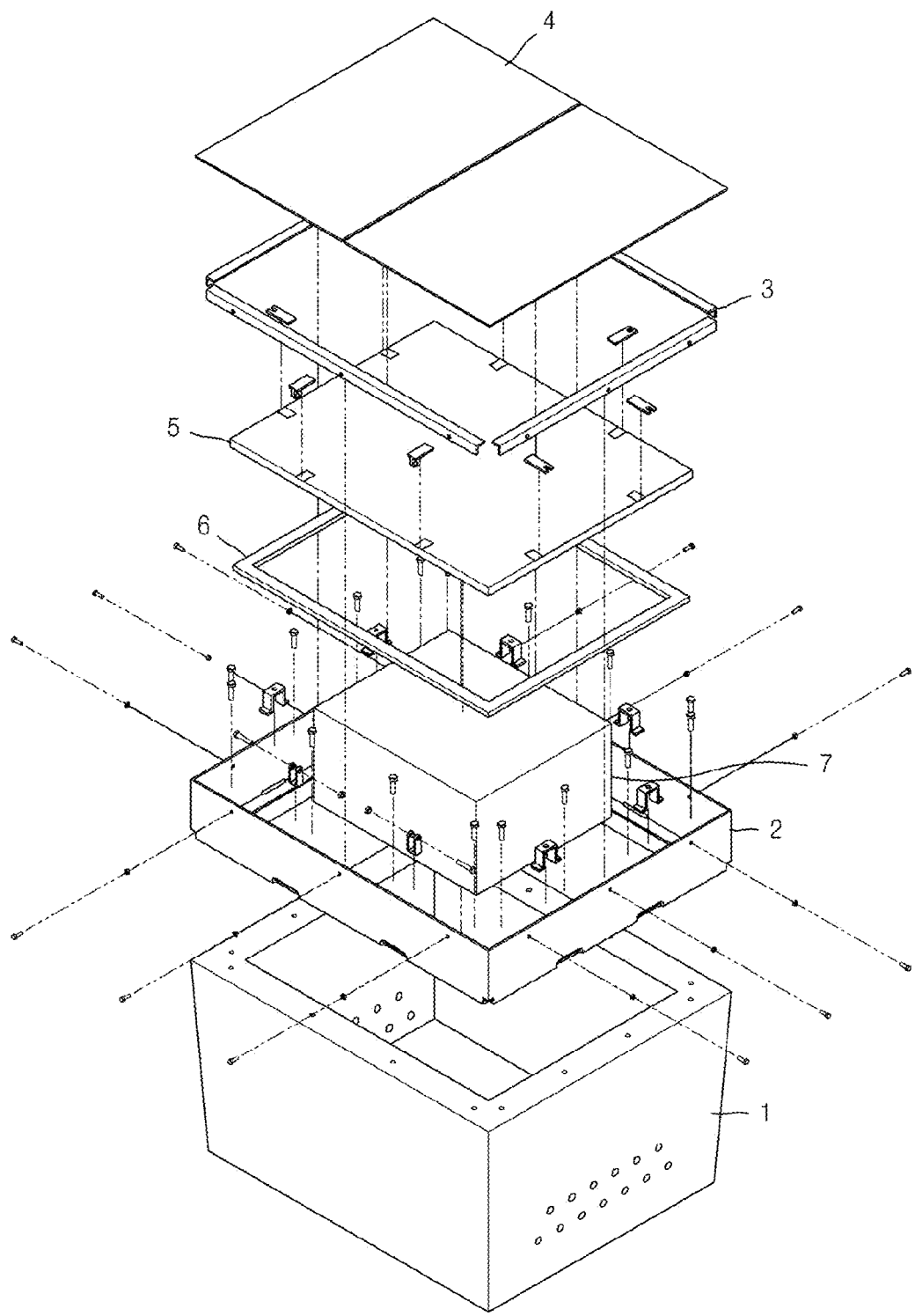
FIG. 1 is a disassembled view of an underground laying type electric equipment container system according to an embodiment of the present invention.

FIG. 1 is a disassembled view of an underground laying type electric equipment container system according to an embodiment of the present invention. Referring to FIG. 1, the underground laying type electric equipment container system includes a buried box 1, a box holder 2, a support 3, an upper cover 4, a lower cover 5, and a waterproof band 6, and an electric equipment box 7. Hereinafter, an assembly process of elements described above and connection between the elements will be described with reference to the disassembled view illustrated in FIG. 1.

The buried box 1 is an outermost portion of the underground laying type electric equipment container system in lateral directions and a downward direction and is usually laid underground in the form of a manhole such that omni-directional lateral sides and an underside thereof are sealed and a portion of an upper surface thereof is opened. the lateral sides and the underside of the buried box 1 are laid underground and in order that the upper cover 4 thereof is horizontal to the surface of the earth, the upper surface of the buried box 1 is mounted downward from the ground surface by a lateral length of the box holder 2. However, according to an installation environment of the buried box 1 or the intention of a person who installs, the upper surface of the buried box 1 may be higher than the ground surface or parallel to the ground surface. In particular, the buried box 1 may preferably be formed of a material that is waterproof and highly durable, such as concrete, so that erosion of electric equipment therein due to moisture of underground, water, or microorganisms is prevented. However, it will be obvious to one of ordinary skill in the art that the buried box 1 may also be formed of other materials than the above-described material. In addition, when laying the buried box 1 underground, a compact process of broken stones may preferably be performed on a underground surface on which the buried box 1 is to be installed so that the buried box 1 is not sunk.

The box holder 2 is formed of a quadrangular horizontal frame covering the upper surface of the buried box 1 and having the same shape as the upper surface of the buried box 1, an inner vertical frame that is orthogonally and upwardly bent from an inner edge of the horizontal frame, and an outer vertical frame that is orthogonally and upwardly bent from an outer edge of the horizontal frame. The horizontal frame of the box holder 2 has the same shape as the upper surface of the buried box 1 in order to cover the upper surface of the buried box 1, and thus, has a quadrangular opened portion corresponding to the opened upper surface of the buried box 1. The electric equipment box 7 is moved through this opened portion. The horizontal frame of the box holder 2 provides space for coupling with the lower cover 5, and the inner vertical frame provides an edge for tight coupling with the waterproof band 6 attached to the lower cover 5, and the outer vertical frame provides an edge for fixing the upper cover 4.

As illustrated in FIG. 1, nut-shaped grooves are formed in the upper surface of the buried box 1, and holes corresponding to the grooves of the buried box 1 are formed in the horizontal frame of the box holder 2. The buried box 1 and the box holder 2 may be coupled to each other as bolts are inserted into the grooves in the upper surface of the buried box 1 through the holes of the horizontal frame of the box holder 2. The horizontal frame of the box holder 2 may be coupled to the upper surface of the buried box 1 in an sealed state as a waterproof agent such as silicone is filled in a coupling portion between the buried box 1 and the box holder 2. The box holder 2 may be formed of a rigid material whose shape is not deformed under any condition. For example, the box holder 2 may be formed of a metal plate.

The support 3 is a shelf-shaped frame that supports the upper cover 4, and is attached to an inner portion of the outer vertical frame of the box holder 2 at a predetermined depth from the outer vertical frame. If the upper cover 4 is protruded from the ground, pedestrians may stumble over the upper cover 4 to fall down, and thus, the support 3 may preferably be attached to the inner portion of the outer vertical frame of the box holder 2 at a deeper depth that is greater than a height of the upper cover 4. The support 3 is formed of a quadrangular horizontal frame that contacts a lower surface of the upper cover 4 and a vertical frame that is orthogonally and downwardly bent from an outer edge of the horizontal frame. Holes for coupling with respect to the lower cover 5 are formed in the vertical frame of the box holder 2, and holes corresponding to the holes of the vertical frame of the box holder 2 are formed in the vertical frame of the support 3. The box holder 2 and the support 3 may be coupled to each other by passing through bolts through the holes of the vertical frame of the box holder 2 and the holes of the vertical frame of the support 3 and tightening nuts on the bolts.

The upper cover 4 is mounted to the support 3 to cover the upper surface of the lower cover 5. As illustrated in FIG. 1, the upper cover 4 is located at an outermost portion of the underground laying type electric equipment container system illustrated in FIG. 1 in an upward direction, and an upper surface of the upper cover 4 is exposed to the outside to function as a pavement. The upper cover 4 may be formed of, for example, a metal slab, a marble slab, a reinforced plastic slab, which is capable of enduring load of pedestrians or cars. Also, the upper cover 4 may be manufactured in the form of a box in which blocks used in pavement nearby may be mounted for harmonization with the pavement nearby.

FIG. 2 illustrates the underground laying type electric equipment container system while the upper cover 4 illustrated in FIG. 1 is closed. FIG. 2A is a perspective view of the underground laying type electric equipment container system while the upper cover 4 illustrated in FIG. 1 is closed. As illustrated in FIG. 2A, the upper cover 4 is formed of two slabs, but may also be formed of a single slab or of two or more slabs. As will be described below, in order to reinforce an adhesive force between an upper portion of the vertical frame of the box holder 2 and the waterproof band 6, a weight of the upper cover 4 may be increased. The upper cover 4 is to be liftable by a user, and thus, the upper cover 4 may be formed of several separate slabs according to the weight of the upper cover 4.

Figure 2A:
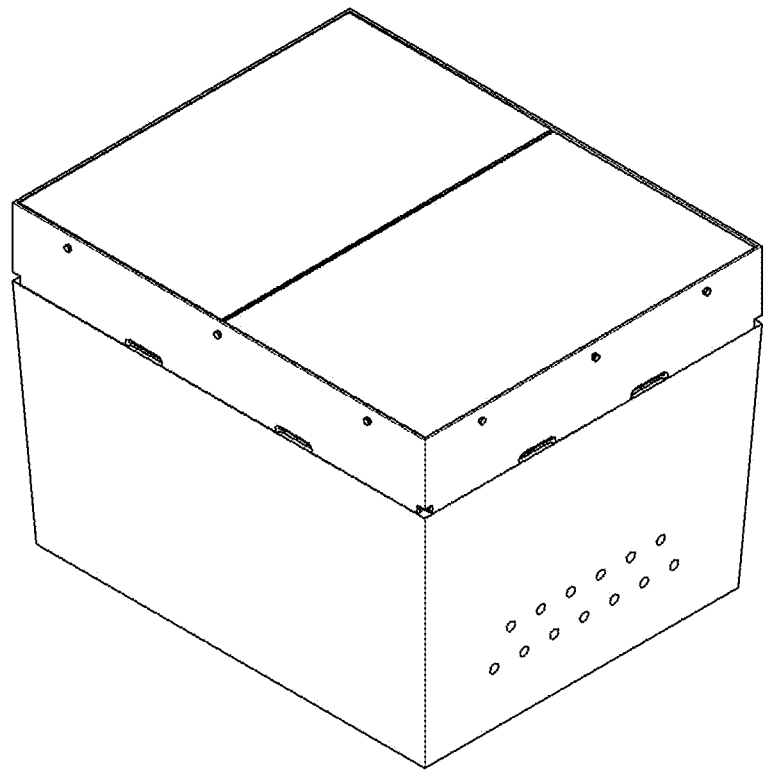
FIGS. 2A-2D illustrate an underground laying type electric equipment container system while an upper cover 4 illustrated in FIG. 1 is closed.
Figure 2B:
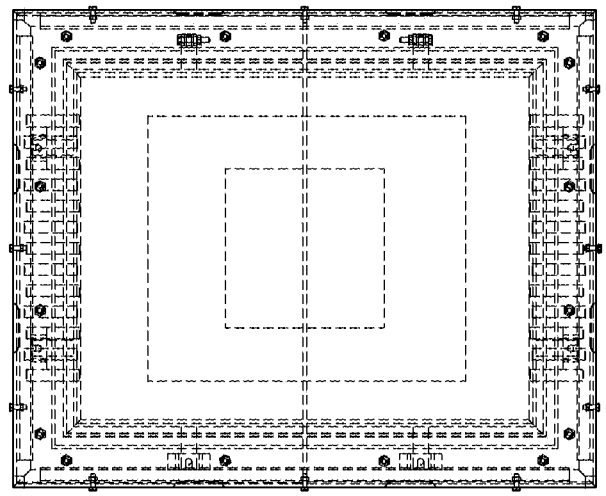

FIG. 2B is a plan view of the underground laying type electric equipment container system while the upper cover 4 illustrated in FIG. 1 is closed. A larger quadrangle shown by a dotted line from among two quadrangles shown by a dotted line in FIG. 2B denotes the electric equipment box 7 in which the buried box 1 is embedded. A smaller quadrangle of the two quadrangles shown by a dotted line in FIG. 2B denotes a space for a dehumidifying agent provided on a lower surface in the buried box 1. The space of the dehumidifying agent is filled with a dehumidifying agent for eliminating moisture generated inside the buried box 1. A representative example of the dehumidifying agent may be silica gel.

Figure 2C:
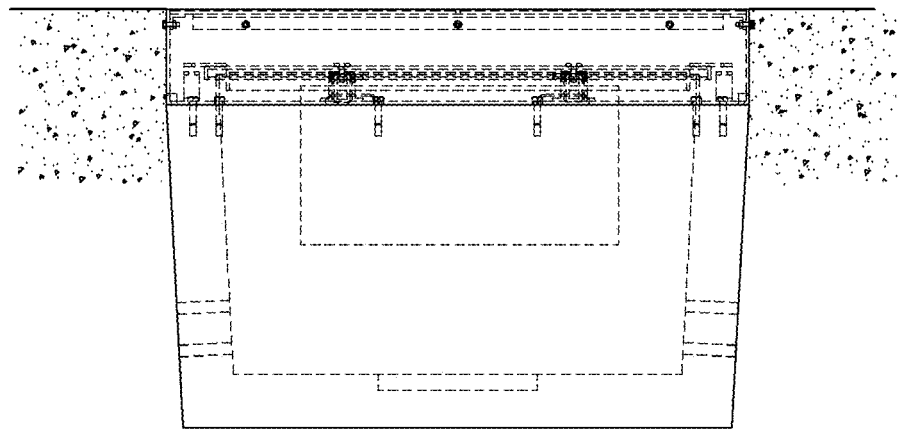
Figure 2D:
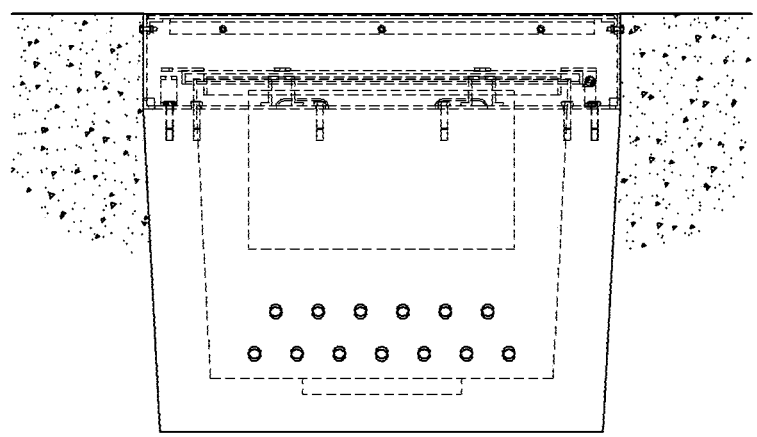
Figure 3A:
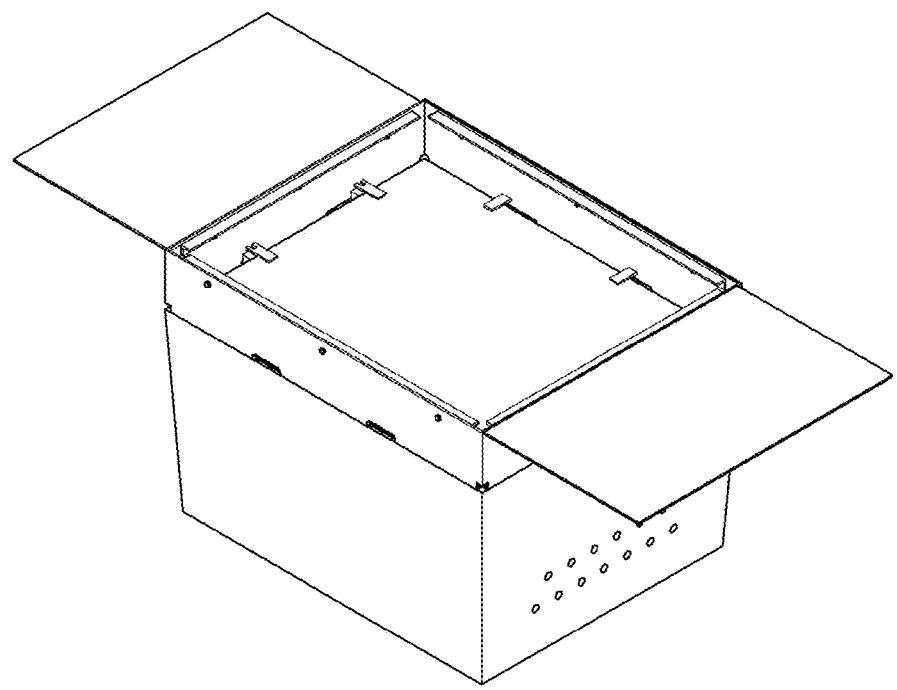
FIGS. 3A-3D illustrate an underground laying type electric equipment container system while the upper cover 4 illustrated in FIG. 1 is opened.
Figure 3B:
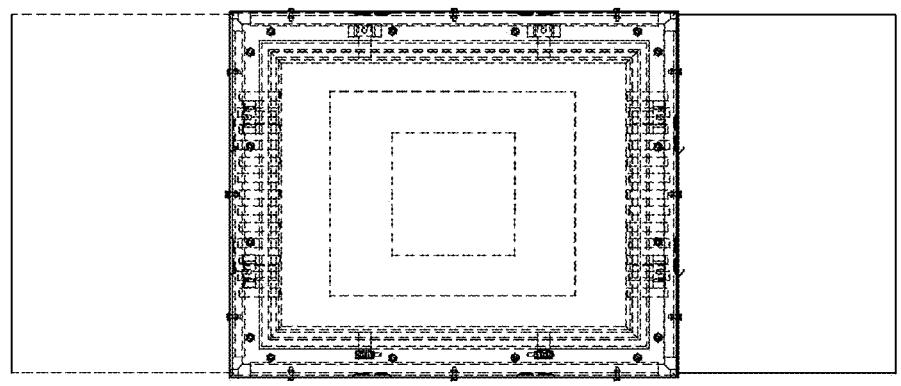
Figure 3C:
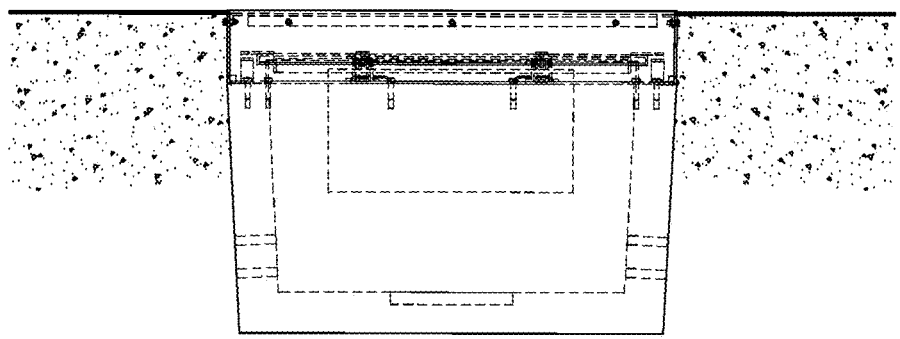
Figure 3D:
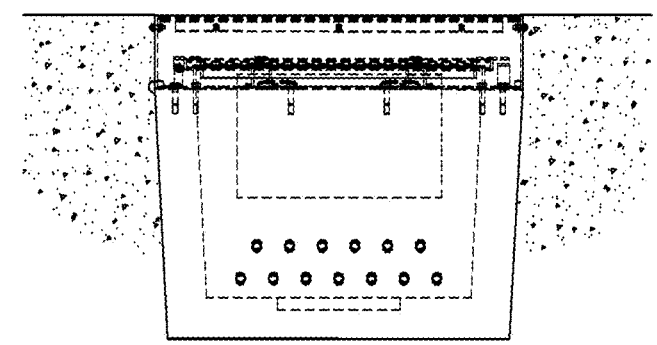
Figure 4A:
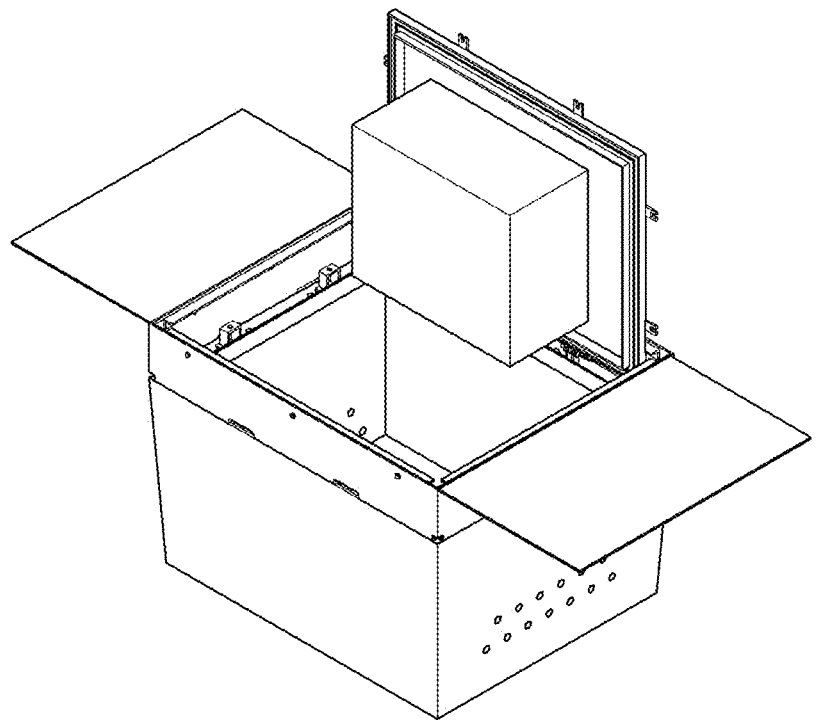
FIGS. 4A-4D illustrate an underground laying type electric equipment container system while a lower cover 5 illustrated in FIG. 1 is opened.
Figure 4B:
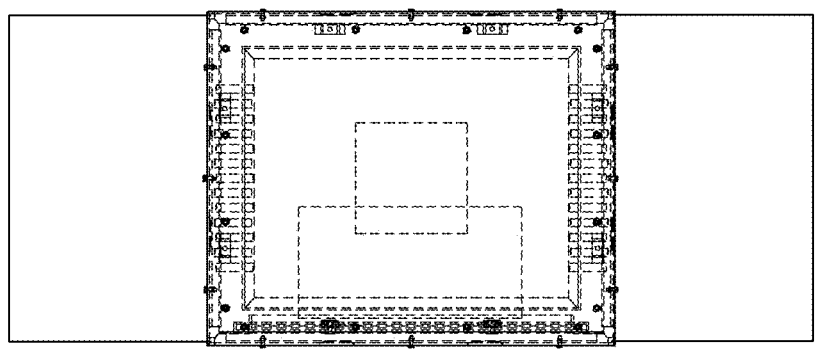
Figure 4C:
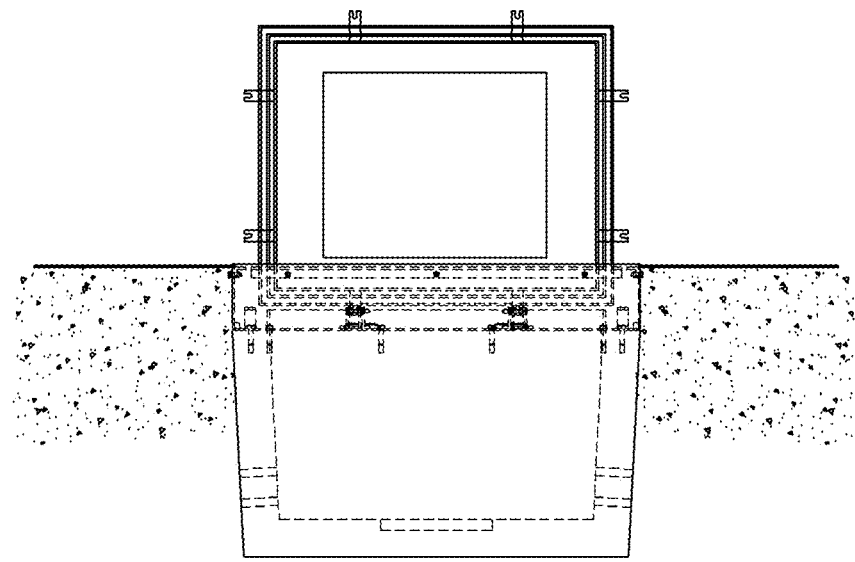
Figure 4D:
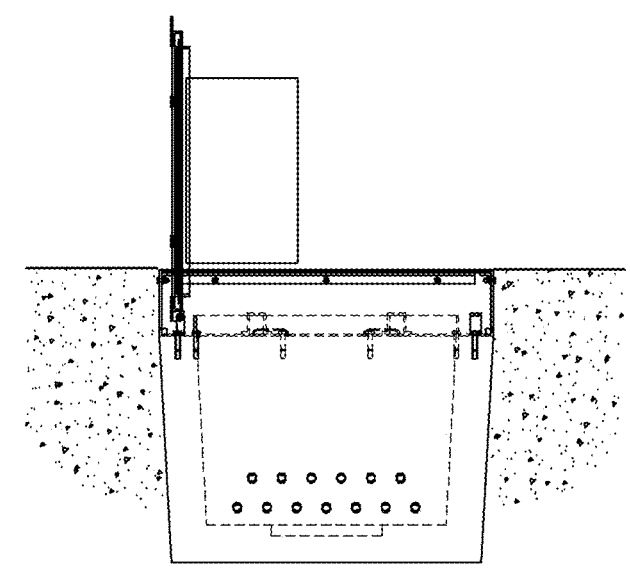
Figure 5A:
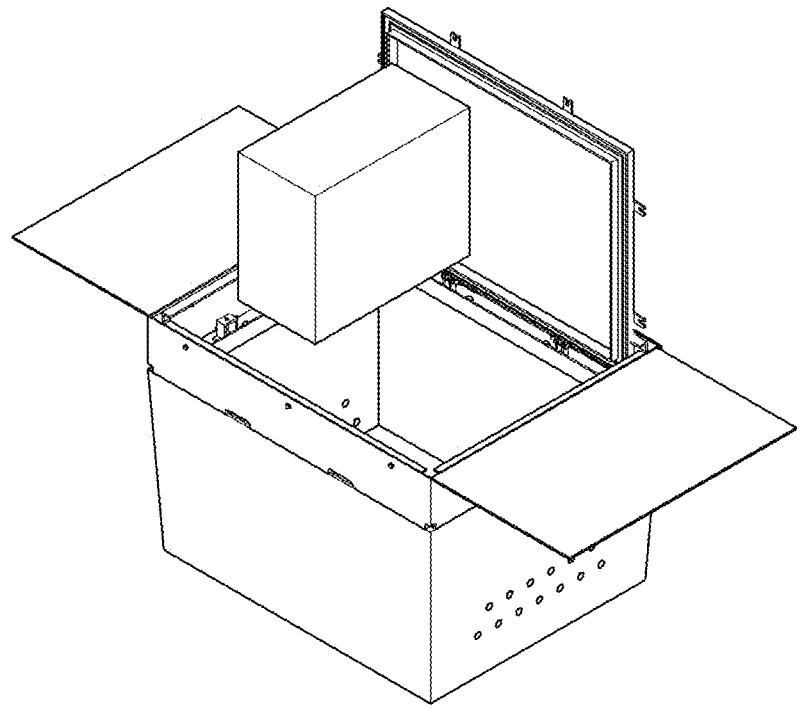
FIGS. 5A-5D illustrate an underground laying type electric equipment container system while an electric equipment box 7 illustrated in FIG. 1 is moved.
Figure 5B:
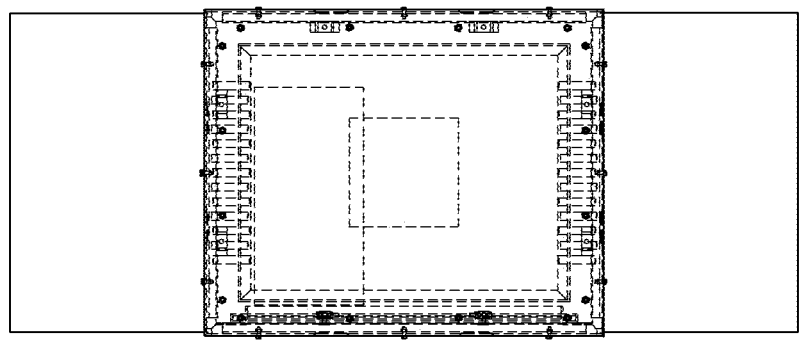
Figure 5C:
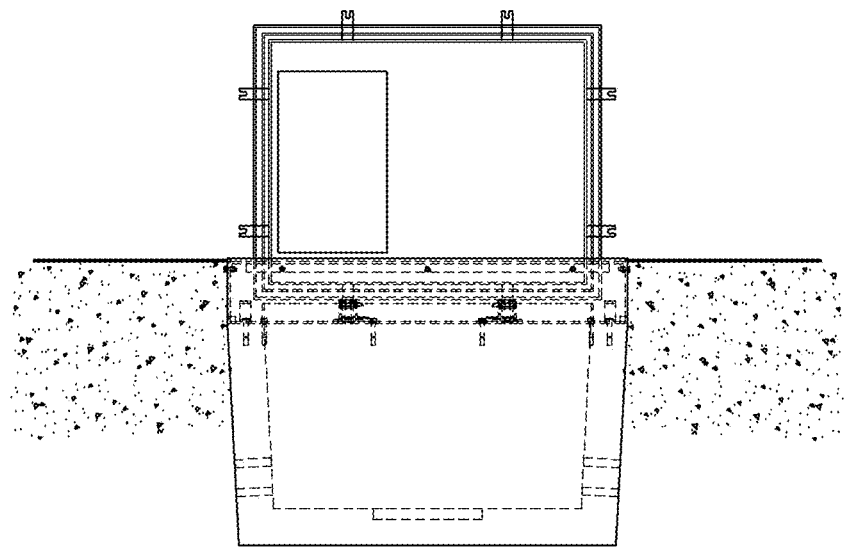
Figure 5D:
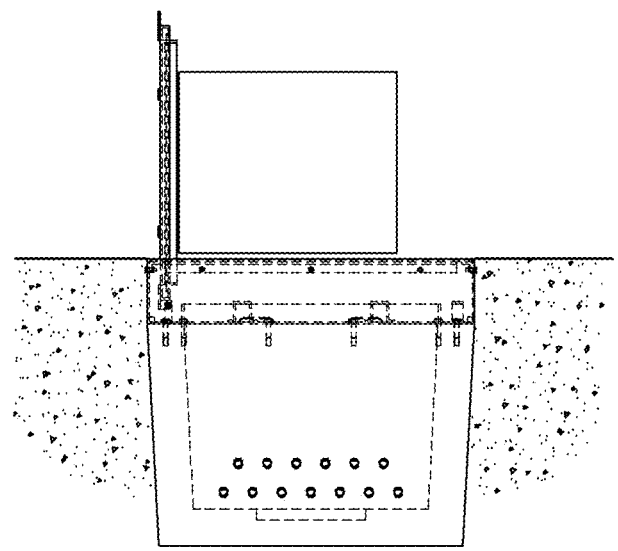

FIG. 2C is a front view of the underground laying type electric equipment container system while the upper cover 4 illustrated in FIG. 1 is closed. FIG. 2D is a side view of the underground laying type electric equipment container system while the upper cover 4 illustrated in FIG. 1 is closed. As illustrated in FIGS. 2C and 2D, the upper cover 4 is an outermost portion of the underground laying type electric equipment container system according to the present embodiment in an upward direction and is located near the surface of the earth. As described above, the whole underground laying type electric equipment container system illustrated in FIG. 1 is laid underground such that the upper surface thereof is horizontal to the surface of the earth. If the underground laying type electric equipment container system illustrated in FIG. 1 is laid underground while it is either protruded from the surface of the earth or sunk underground, safety of pedestrians may be threatened by the underground laying type electric equipment container system.

As illustrated in FIGS. 2C and 2D, lower links of the box holder 2 and upper links of the lower cover 5 are connected to each other so that the box holder 2 and the lower cover 5 are coupled to each other, and as the waterproof band 6 and a circumference of the upper portion of the inner vertical frame of the box holder 2 are coupled to each other, a coupling portion between the box holder 2 and the lower cover 5 are sealed. The electric equipment box 7 that is moved as a single body with the lower cover 5 is located in the sealed inner space of the buried box 1 according to a position where the lower cover 5 covers the box holder 2.

FIG. 3 illustrates the underground laying type electric equipment container system while the upper cover 4 illustrated in FIG. 1 is opened. FIG. 3A is a perspective view of the underground laying type electric equipment container system while the upper cover 4 illustrated in FIG. 1 is opened. FIG. 3B is a plan view of the underground laying type electric equipment container system while the upper cover 4 illustrated in FIG. 1 is opened. FIG. 3C is a front view of the underground laying type electric equipment container system while the upper cover 4 illustrated in FIG. 1 is opened. FIG. 3D is a side view of the underground laying type electric equipment container system while the upper cover 4 illustrated in FIG. 1 is opened.

As illustrated in FIG. 3, as two slabs which form the upper cover 4 are moved out of the box holder 2, the lower cover 5 is exposed to the outside. For example, the user may move the upper cover 4 out of the box holder 2 by lifting the upper cover 4 from the support 3. To prevent loss of the upper cover 4, the upper cover 4 may be connected to the box holder 2 or the box via a chain or wire. Alternatively, a security device such as a lock may be inserted between the upper cover 4 and the box holder 2 or the buried box 1 so that only a user who has a right regarding the electric equipment box 7 may move the upper cover 4.

The lower cover 5 seals a rectangular hole of the box holder 2 by covering the entire upper portion of the inner vertical frame of the box holder 2. As illustrated in FIG. 1, outer lines of the rectangular hole of the box holder 2 is formed along the upper portion of the inner vertical frame, and thus, the lower cover 5 may cover the entire upper portion of the inner vertical frame of the box holder 2, thereby sealing the rectangular holes of the box holder 2. To seal the rectangular hole of the box holder 2, the waterproof band 6 that covers the entire upper portion of the inner vertical frame of the box holder 2 is attached to a lower surface of the lower cover 5, and coupling devices that allow adhesion between the upper portion of the inner vertical frame of the box holder 2 and the waterproof band 6 are installed on an upper surface of the horizontal frame of the box holder 2 and the lower cover 5. Some of the coupling devices that are temporarily coupled, from among the devices coupling the upper surface of the horizontal frame of the box holder 2 and the lower cover 5, may be coupled to each other or separated from each other by user's manipulation.

While some of the coupling devices are separated, the lower cover 5 is rotatable with respect to other coupling devices that are permanently coupled, as an axis of rotation, from among the coupling devices of the upper surface of the horizontal frame of the box holder 2 and the lower cover 5, by user's manipulation. The sealed inner space of the buried box 1 is formed as the waterproof band 6 is adhered to the upper portion of the upper surface of the horizontal frame of the box holder 2 by rotation of the lower cover 5 according to user's manipulation and the rectangular hole of the box holder 2 are sealed accordingly. When the user moves the lower cover 5 in an arbitrary direction or to an arbitrary position, the possibility of a danger to a user or damages to structures such as the box holder 2 and the lower cover 5 according to movement of the lower cover 5 is high. According to the present embodiment, sealing of the buried box 1 and movement of the electric equipment box 7 are conducted just by user's rotating the lower cover 5 with respect to the coupling devices fixed to the buried box 1, as an axis of rotation, and thus, most of the danger of accidents to the user and damages to the structures according to movement of the lower cover 5 is eliminated.

As the rectangular hole of the box holder 2 is sealed, inner space of the buried box 1 in which the electric equipment box 7 is located is sealed. Consequently, rain water or the like is not able to penetrate into the electric equipment embedded in the electric equipment box 7. Waterproof capability of the underground laying type electric equipment container system illustrated in FIG. 1 is determined based on a degree of adhesion between the upper portion of the inner vertical frame of the box holder 2 and the waterproof band 6. According to the conventional underground laying type electric equipment container system disclosed in Korean Patent No. 0947101 or Korean Utility Model No. 0443588, waterproof capability of the underground laying type electric equipment container system is determined based on a force of a power unit such as a motor and thus coupling devices as those described above are not needed. According to the underground laying type electric equipment container system illustrated in FIG. 1, the upper portion of the inner vertical frame of the box holder 2 and the waterproof band 6 are adhered to each other manually, and thus, coupling devices that allow adhesion between the upper portion of the inner vertical frame of the box holder 2 and the waterproof band 6 are needed. As described above, as the box holder 2 of the buried box 1 and the lower cover 5 seal inner space of a box, which is laid underground, by user's manipulation, the electric equipment may be manually moved to the sealed inner space of the box.

As described above, the coupling devices that allow adhesion between the upper portion of the inner vertical frame of the box holder 2 and the waterproof band 6 are installed on the upper surface of the horizontal frame of the box holder 2, and the coupling devices that allow adhesion between the upper portion of the inner vertical frame of the box holder 2 and the waterproof band are installed on the lower cover 5. Examples of the coupling device are links and hinges illustrated in FIG. 1. Links are representative coupling devices that allow objects coupled by the links are coupled or separated by user's manipulation, and various types of links other than the links illustrated in FIG. 1 may be applied to the present embodiment. Hinges are representative coupling devices that allow objects coupled by the hinges are rotatable within up to a predetermined critical angle, and various types of hinges other than the hinges illustrated in FIG. 1 may be applied to the present embodiment.

As illustrated in FIG. 1, six lower links and two lower hinges are attached to the upper surface of the horizontal frame of the box holder 2, and six upper links corresponding to the six lower links and two upper hinges corresponding to the two lower hinges are attached to the lower cover 5. Referring to FIG. 1, although the upper links and the upper hinges are attached to an upper surface of the lower cover 5, they may also be attached to the lower surface or a lateral surface of the lower cover 5. The horizontal frame of the box holder 2 and three lateral sides of the lower cover 5 may be respectively temporarily coupled to one another as the user temporarily connects the six upper links and the six lower links. The horizontal frame of the box holder 2 and the remaining one lateral side of the lower cover 5 may be permanently coupled to each other as the two lower hinges and the two upper hinges are permanently coupled to each other. While the six lower links and the six upper links attached to the horizontal frame of the box holder 2 and the three lateral sides of the lower cover 5 are separated, the lower cover 5 may be freely rotated with respect to the hinges, which are permanent coupling devices with respect to the box holder 2, as an axis of rotation, within up to a predetermined angle allowed by the hinges by user's manipulation. While the six lower links and the six upper links attached to the horizontal frame of the box holder 2 and the three lateral sides of the lower cover 5 are connected to each other, the lower cover 5 is coupled to all lateral sides of the horizontal frame of the box holder 2 and thus is not able to rotate.

A gap that runs along a circumference of the lower surface of the lower cover 5 is formed in the lower surface of the lower cover 5 along the circumference of the upper portion of the inner vertical frame of the box holder 2, and the waterproof band 6 is inserted into the gap to be adhered. The waterproof band 6 may be formed of an elastic material such as rubber or silicone. For example, the waterproof band 6 may be formed as a rubber packing. When the box holder 2 and the lower cover 5 are coupled to each other by the upper links and the lower links connected to each other, the waterproof band 6 attached to the lower surface of the lower cover 5 is pressed by the upper portion of the inner vertical frame of the box holder 2, and tight coupling between the inner vertical frame of the box holder 2 and the waterproof band 6 due to this pressing seals the gap between the inner vertical frame of the box holder 2 and the lower cover 5.

As described above, when the coupling portions between the buried box 1 and the box holder 2 are sealed, and the coupling portions between the box holder 2 and the lower cover 5 are sealed, the inner space of the buried box 1 is sealed from the outside. The coupling portion between the buried box 1 and the box holder 2 are permanently sealed by using a material such as a waterproof agent, but the coupling portions between the box holder 2 and the lower cover 5 are temporarily sealed by the tight coupling between the inner vertical frame of the box holder 2 and the waterproof band 6. Thus, waterproof capability of the underground laying type electric equipment container system illustrated in FIG. 1 is determined based on a degree of the adhesion between the upper portion of the inner vertical frame of the box holder 2 and the waterproof band 6. The degree of the adhesion between the upper portion of the inner vertical frame of the box holder 2 and the waterproof band 6 may also depend only on a human strength of the user who connects the upper links and the lower links. However, if the degree of adhesion by the human strength of the user is not sufficient, the adhesive force between the upper portion of the inner vertical frame of the box holder 2 and the waterproof band 6 may be increased, in addition to the human strength of the user, by the weight of the lower cover 5, the weight of the upper cover 4, and the weight of the electric equipment box 7. For example, if the weight of the lower cover 5 increases, a gravitational force acting on the lower cover 5 may increase, and accordingly, a force of the waterproof band 6 attached to the lower cover 5, that presses the upper portion of the inner vertical frame of the box holder 2 also increases.

The electric equipment box 7 is a box in which an electric equipment is embedded, and may be located in the sealed inner space of the buried box 1 that is formed as the upper portion of the inner vertical frame of the box holder 2 and the waterproof band 6 are adhered by user's manipulation or may be located outside the buried box 1. Examples of the electric equipment may include an outdoor transformer, an outdoor communication equipment, a streetlight panel board, or a traffic signal controller. The electric equipment box 7 may also be referred to as a panel board or a terminal board. As described above, since the electric equipment box 7 may be located inside the buried box 1 that is laid underground, facilities related to electric equipment such as electric poles are no longer present on the ground, thereby improving the appearance of the city, allowing efficient use of city space, and providing safety because falling danger of the facilities is eliminated.

According to the present embodiment, in order to minimize the manufacturing costs and the size of the underground laying type electric equipment container system, the electric equipment box 7 is attached to the lower surface of the lower cover 5 that seals the inner space of the buried box 1. As described above, as the electric equipment box 7 is attached to the lower surface of the lower cover 5, the electric equipment box 7 may move with the lower cover 5 as a single body. For example, in regard to the electric equipment box 7 located in the sealed inner space of the buried box 1, the lower cover 5 is separated almost at a right angle with respect to the horizontal frame of the box holder 2 from the upper surface of the inner vertical frame of the box holder 2 by rotation of the lower cover 5 according to user's manipulation, and at the same time, the electric equipment box 7 may be moved out of the buried box 1 as a single body with the lower cover 5. In addition, the electric equipment box 7 located outside the buried box 1 may be moved into the sealed inner space of the buried box 1 as a single body with the lower cover 5 at the same time when the waterproof band 6 attached to the lower cover 6 is adhered to the upper surface of the inner vertical frame of the box holder 2 by rotation of the lower cover 5 according to user's manipulation. As described above, since the electric equipment box 7 located in the sealed inner space of the buried box 1 may be moved out of the buried box 1 according to user's manipulation, maintenance and repair of the electric equipment is easy.

An upper surface of the electric equipment box 7 is attached to an inner surface of the lower surface of the lower cover 5 that is surrounded by the waterproof band 6. Coupling devices that allow attachment of the electric equipment box 7 are installed on the upper surface of the electric equipment box 7 and the lower surface of the lower cover 5. From among the coupling devices on the upper surface of the electric equipment box 7 and the lower surface of the lower cover 5, some coupling devices that are temporarily coupled may be coupled to each other or separated from each other by user's manipulation. While some of the coupling devices are separated, the electric equipment box 7 is rotatable with respect to other coupling devices that are permanently coupled, as an axis of rotation, from among the coupling devices of the upper surface of the electric equipment box 7 and the lower surface of the lower cover 5, by user's manipulation.

As described above, the coupling devices for coupling with respect to the electric equipment box 7 are installed on the lower surface of the lower cover 5, and coupling devices for coupling with respect to the lower cover 5 are installed on the upper surface of the electric equipment box 7. For example, like the upper surface of the horizontal frame of the box holder 2, six upper links and two upper hinges may be attached to the lower surface of the lower cover 5. Like the lower cover 5, six lower links corresponding to the upper links and two lower hinges corresponding to the two upper hinges may be attached to the upper surface of the electric equipment box 7. The links and the hinges can be classified into upper ones and lower ones based on a state in which the electric equipment box 7 is located inside the sealed inner space of the buried box 1. However, as described above, rotating subjects are the lower cover 5 and the electric equipment box 7, and thus, the lower links and the lower hinges attached to the upper surface of the horizontal frame of the box holder 2 and the upper links and the upper hinges attached to the lower surface of the lower cover 5 are the same type, and the upper links and the upper hinges attached to the lower cover 5 and the lower links and the lower hinges attached to the upper surface of the electric equipment box 7 are the same type.

The upper surface of the electric equipment box 7 and three lateral sides of the lower surface of the lower cover 5 may be temporarily coupled to one another as the user temporarily connects the six upper links and the six lower links. The upper surface of the electric equipment box 7 and the remaining one lateral side of the lower cover 5 may be permanently coupled to each other as the two lower hinges and the two upper hinges are permanently coupled to each other. While the six lower links and the six upper links attached to the upper surface of the electric equipment box 7 and the three lateral sides of the lower surface of the lower cover 5 are separated, the electric equipment box 7 may be freely rotated with respect to the hinges, which are permanent coupling devices with respect to the box holder 2, as an axis of rotation, within up to a predetermined angle allowed by the hinges by user's manipulation. While the six lower links and the six upper links attached to the upper surface of the electric equipment box 7 and the three lateral sides of the lower surface of the lower cover 5 are connected to each other, the upper surface of the electric equipment box 7 is coupled to all lateral sides of the lower surface of the lower cover 5 and thus is not able to rotate.

To allow the electric equipment in the electric equipment box 7 and the electric equipment outside the buried box 1 to electrically communicate with each other, as illustrated, for example, in FIG. 1, a plurality of holes, through which a plurality of cables connecting the electric equipment in the electric equipment box 7 and the electric equipment outside the buried box 1 may be laid, may be formed in a portion of the lateral side of the buried box 1. A cable is passed through one of the holes and then a gap between the hole and the cable is filled with a waterproof agent, thereby sealing the gap between the hole and the cable. Also, some of the holes that are not used in laying of the cable may be completely filled with a waterproof agent to be sealed. In particular, the cable that is laid as above has a length that is enough not to disturb vertical movement of the electric equipment box 7 inside the buried box 1. However, if electrical conduction between the electric equipment in the electric equipment box 7 and the electric equipment outside the buried box 1 is performed in a wireless manner, a wired cable as above is not necessarily to be laid in the buried box 1. Examples of the electric equipment outside the buried box 1 may be an electric equipment of a power plant or an electric equipment in another buried box besides the buried box 1. Furthermore, a cable that protects other electric equipment such as a ground cable may be laid in the buried box 1.

If the electric equipment of the electric equipment box 7 is an outdoor transformer, a high-voltage current flows through electric elements such as wires, coils, or terminals that constitute the electric equipment. In this case, if a high voltage is temporarily applied to the electric elements of the electric equipment, an insulated state of the air in the buried box 1 is collapsed. Here, discharge in the air is generated with sparks in the buried box 1. Due to expansion of the air due to the sparks or expansion of the air due to heat of a chemical reaction during the discharge in the air, a pressure in the buried box 1 is gradually increased. Accordingly, if a high-voltage current flows through the electric elements of the electric equipment, a decompression device that reduces an internal pressure of the buried box 1, for example, a safety valve, may be additionally inserted into the lower cover 5.

FIG. 4 illustrates the underground laying type electric equipment container system while the lower cover 5 illustrated in FIG. 1 is opened. FIG. 4A is a perspective view of the underground laying type electric equipment container system while the lower cover 5 illustrated in FIG. 1 is opened. FIG. 4B is a plan view of the underground laying type electric equipment container system while the lower cover 5 illustrated in FIG. 1 is opened. FIG. 4C is a front view of the underground laying type electric equipment container system while the lower cover 5 illustrated in FIG. 1 is opened. FIG. 4D is a side view of the underground laying type electric equipment container system while the lower cover 5 illustrated in FIG. 1 is opened. As illustrated in FIG. 4, as the user lifts the lower cover 5 so that the lower cover 5 is pulled back by rotating 90 degrees or more from a horizontal position thereof, the electric equipment box 7 rotates as a single body with the lower cover 5 to be moved out of the buried box 1. When the lower cover 5 rotates from the horizontal position thereof by 90 degrees or more, a gravitational force acting on the lower cover 5 is directed in an opposite direction from a direction in which the lower cover 5 is closed, and a portion of the upper surface of the lower cover 5 contacts the upper portion of the outer vertical frame of the box holder 2 so as to fix the lower cover 5.

As illustrated in FIG. 4, as the lower links of the box holder 2 and the upper links of the lower cover 5 are separated from each other, the box holder 2 and the lower cover 5 are separated from each other, and the lower cover 5 is finally separated from the box holder 2 almost at a right angle with respect to the box holder 2. The electric equipment box 7 is located outside the buried box 1 corresponding to the position of the lower cover 5 at which the lower cover 5 is at a right angle with respect to the box holder 2. In this state, the user may easily access the electric equipment box 7. In order to allow the user to access the electric equipment box 7 even more safely, a unit that fixes the position of the lower cover 5 may be used.

According to the present embodiment, movement of the lower cover 5 as described above is based on rotation of the lower cover 5 with respect to the hinges that connect the lower cover 5 and the box holder 2. The present embodiment relates to a manual system in which rotation of the lower cover 5 is conducted by a human strength of a user. If the weight of an electric equipment is considerably high, the lower cover 5 may not be moved by a human strength of the user or an accident that the lower cover 5 is suddenly closed due to negligence of the user may occur. To compensate for such problems, an assistant device that increases a human strength of the user acting on the lower cover 5 to rotate the lower cover 5 may be installed between the lower cover 5 and the box holder 2.

FIG. 5 illustrates the underground laying type electric equipment container system while the electric equipment box 7 illustrated in FIG. 1 is moved. FIG. 5A is a perspective view of the underground laying type electric equipment container system while the electric equipment box 7 illustrated in FIG. 1 is moved. FIG. 5B is a plan view of the underground laying type electric equipment container system while the electric equipment box 7 illustrated in FIG. 1 is moved. FIG. 5C is a front view of the underground laying type electric equipment container system while the electric equipment box 7 illustrated in FIG. 1 is moved. FIG. 5D is a side view of the underground laying type electric equipment container system while the electric equipment box 7 illustrated in FIG. 1 is moved.

As illustrated in FIG. 5, as the lower links of the box holder 2 and the upper links of the lower cover 5 are separated from each other, the box holder 2 and the lower cover 5 are separated from each other, and the lower cover 5 is finally separated from the box holder 2 almost at a right angle with respect to the box holder 2. In this state, the upper surface of the electric equipment box 7 is exposed to the outside. A user interface panel of the electric equipment is disposed in an inner portion at the upper surface of the electric equipment box 7, and thus, the user may access the user interface panel of the electric equipment by opening the upper surface of the electric equipment box 7. To allow the user to stably manipulate the user interface panel of the electric equipment, a unit that fixes a position of the electric equipment box 7 may be used.

Figure 6:
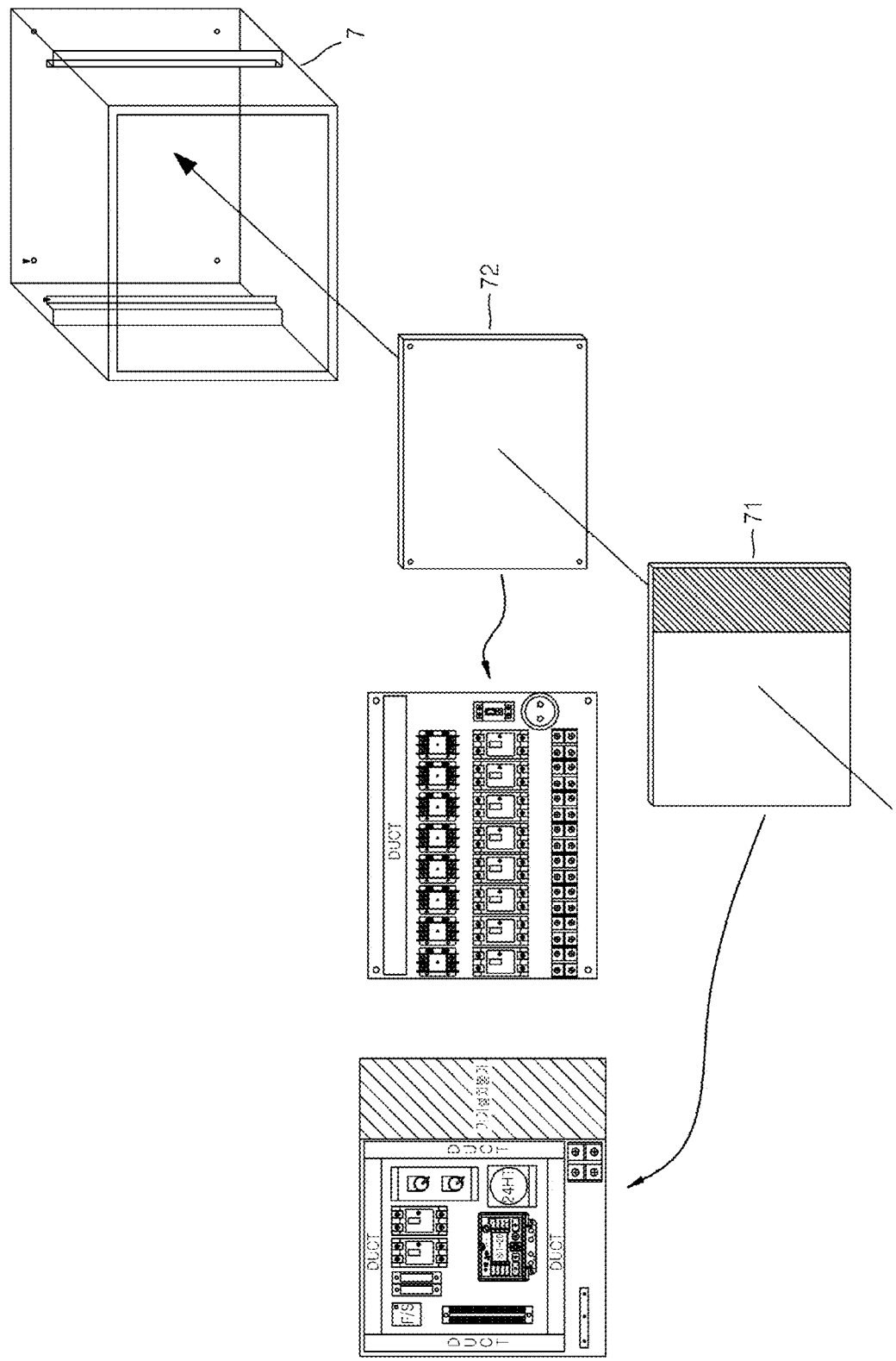
FIG. 6 illustrates an electric equipment being embedded in the electric equipment box 7 illustrated in FIG. 1.

FIG. 6 illustrates an electric equipment being embedded in the electric equipment box 7 illustrated in FIG. 1. Referring to FIG. 6, the electric equipment is formed of two substrates on which multiple components are installed. To embed the electric equipment in the electric equipment box 7, two boards 71 and 72 are installed in the electric equipment box 7. The substrate installed on the board 71 is exposed to the outside and thus is not difficult for the user to manipulate the same. However, the substrate installed on the board 72 is covered by the board 71, and thus, to manipulate the substrate installed on the board 72, the board 71 is to be moved. To this end, the board 71 and the electric equipment box 7 are connected to each other by hinges so that the board 71 may be freely rotated with respect to a coupling portion with the electric equipment box 7 as an axis of rotation, by using the hinges. Also, in order to allow the board 71 to rotate at a right angle, no component may be installed in a portion of the substrate that overlaps with the electric equipment box 7 according to the right-angled rotation of the board 71.

Figure 7:
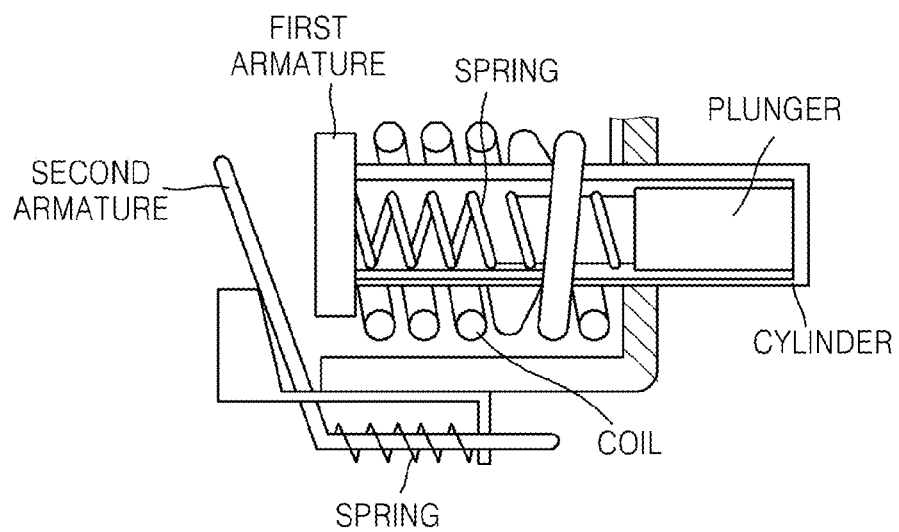
FIG. 7 illustrates examples of components of an electric equipment embedded in the electric equipment box 7 illustrated in FIG. 1.

FIG. 7 illustrates examples of components of the electric equipment embedded in the electric equipment box 7 illustrated in FIG. 1. A representative example of electric equipment embedded in the electric equipment box 7 is a circuit breaker. In FIG. 7, an over-current trip device is illustrated as a representative example of components that constitute the circuit breaker. If a current flowing through a coil illustrated in FIG. 7 exceeds a rated current, a plunger is pulled to be moved towards a first armature, and then a second armature is pulled to automatically block the circuit breaker. If an even higher current flows, a magnetic flux of a magnetic circuit increases, and thus the second armature is pulled even though the plunger does not move, thereby automatically blocking the circuit breaker. However, due to a gravitational force acting on the plunger, an operational current whereby the circuit breaker is blocked may be changed due to an attachment angle of the circuit breaker.

As described above, an electric equipment that includes at least one component whose performance changes according to various directions of Earth's gravitational force may be embedded in the electric equipment box 7. In order for the electric equipment to operate normally, a direction of the user interface panel of the electric equipment has to be opposite direction to Earth's gravitational force. In this case, the direction of the user interface panel of the electric equipment has to be towards the upper surface of the electric equipment box 7, and the user interface panel of the electric equipment is opened to the outside through the upper surface of the electric equipment box 7. The upper surface of the electric equipment box 7 located inside the sealed inner space of the buried box 1 contacts the lower surface of the lower cover 5, and the electric equipment box 7 is moved with the lower cover 5 as a single body and is exposed to the outside. Accordingly, the upper surface of the electric equipment box 7 is covered by the lower surface of the lower cover 5 and thus the user is not able to access the upper surface.

To solve this problem, according to the present embodiment, the upper surface of the electric equipment box 7 may be temporarily attached to the lower surface of the lower cover 5 so that the user may access the user interface panel of the electric equipment by opening the upper surface of the electric equipment box 7 that is temporarily attached to the lower surface of the lower cover 5. That is, as described above, some of the coupling devices of the upper surface of the electric equipment box 7 and the lower surface of the lower cover 5 that are temporarily coupled may be coupled to each other or separated from each other by user's manipulation, and while some of the coupling devices are separated, the electric equipment box 7 may be rotatable with respect to other coupling devices that are permanently coupled, as an axis of rotation, from among the coupling devices of the upper surface of the electric equipment box 7 and the lower surface of the lower cover 5, by user's manipulation. As the user is able to rotate the electric equipment box 7 with respect to the coupling device fixed to the lower cover 5, the user may access the user interface panel of the electric equipment even when an opening surface of the user interface panel of the electric equipment is covered by the lower surface of the lower cover 5 due to the installation direction of the electric equipment embedded in the electric equipment box 7.

As illustrated in FIG. 5, in regard to the electric equipment box 7 attached to the lower surface of the lower cover 5, when the upper surface of the electric equipment box 7 is separated from the lower surface of the lower cover 5 by rotation of the electric equipment box 7 according to user's manipulation, the upper surface of the electric equipment box 7 is opened at the same time. That is, as the lower links of the electric equipment box 7 and the upper links of the lower cover 5 are separated from each other, the upper surface of the electric equipment box 7 is separated from the lower surface of the lower cover 5 almost at a right angle with respect to the lower cover 5, and at the same time, the upper surface of the electric equipment box 7 is completely exposed to the outside. On the contrary, the upper surface of the electric equipment box 7 that is separated from the lower surface of the lower cover 5 almost at a right angle is adhered to the lower surface of the lower cover 5 by rotation of the lower cover 5 according to user's manipulation, and at the same time, the upper surface of the electric equipment box 7 is covered by the lower surface of the lower cover 5.

Figure 8:
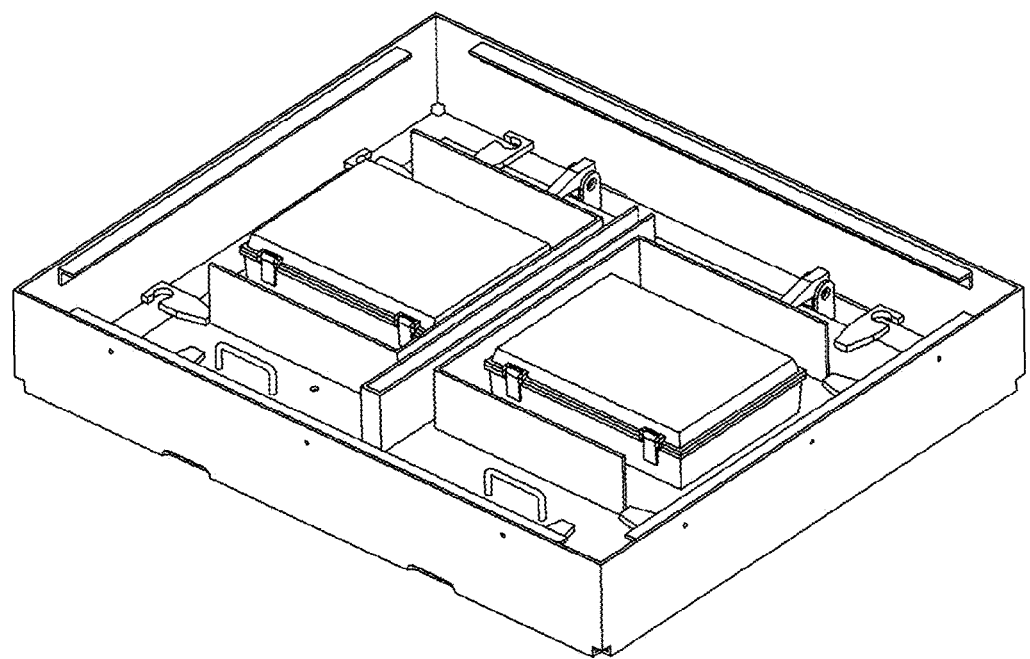
FIG. 8 is a detailed perspective view of the underground laying type electric equipment container system in which the lower cover 5 illustrated in FIG. 1 is closed.
Figure 9:
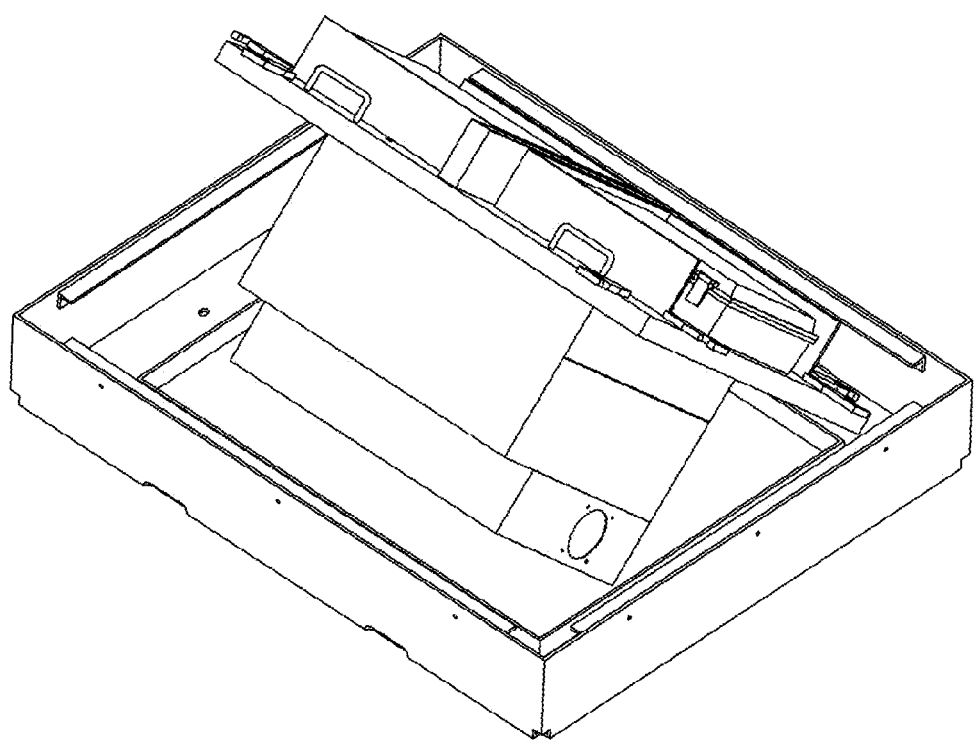
FIG. 9 is a detailed perspective view of the underground laying type electric equipment container system in which about a half of the lower cover 5 illustrated in FIG. 1 is opened.
Figure 10:
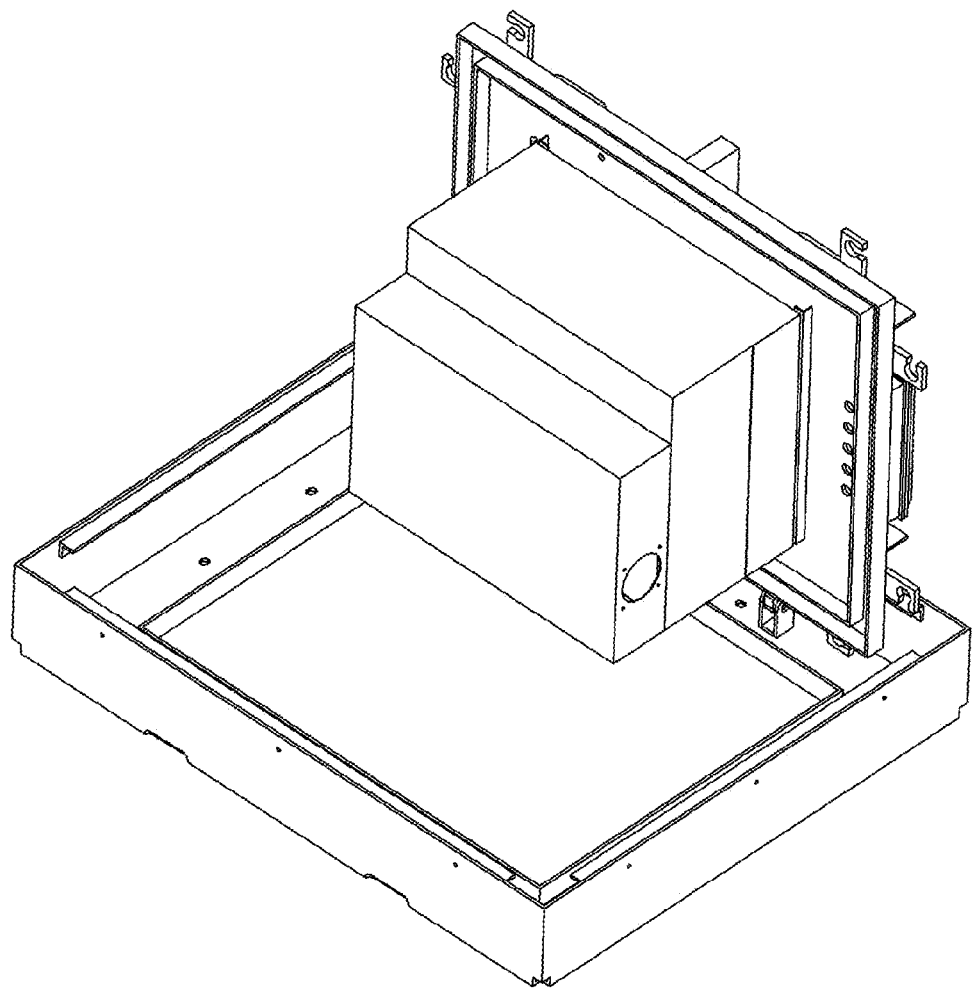
FIG. 10 is a detailed perspective view of the underground laying type electric equipment container system in which the lower cover 5 illustrated in FIG. 1 is completely opened.
Figure 11:
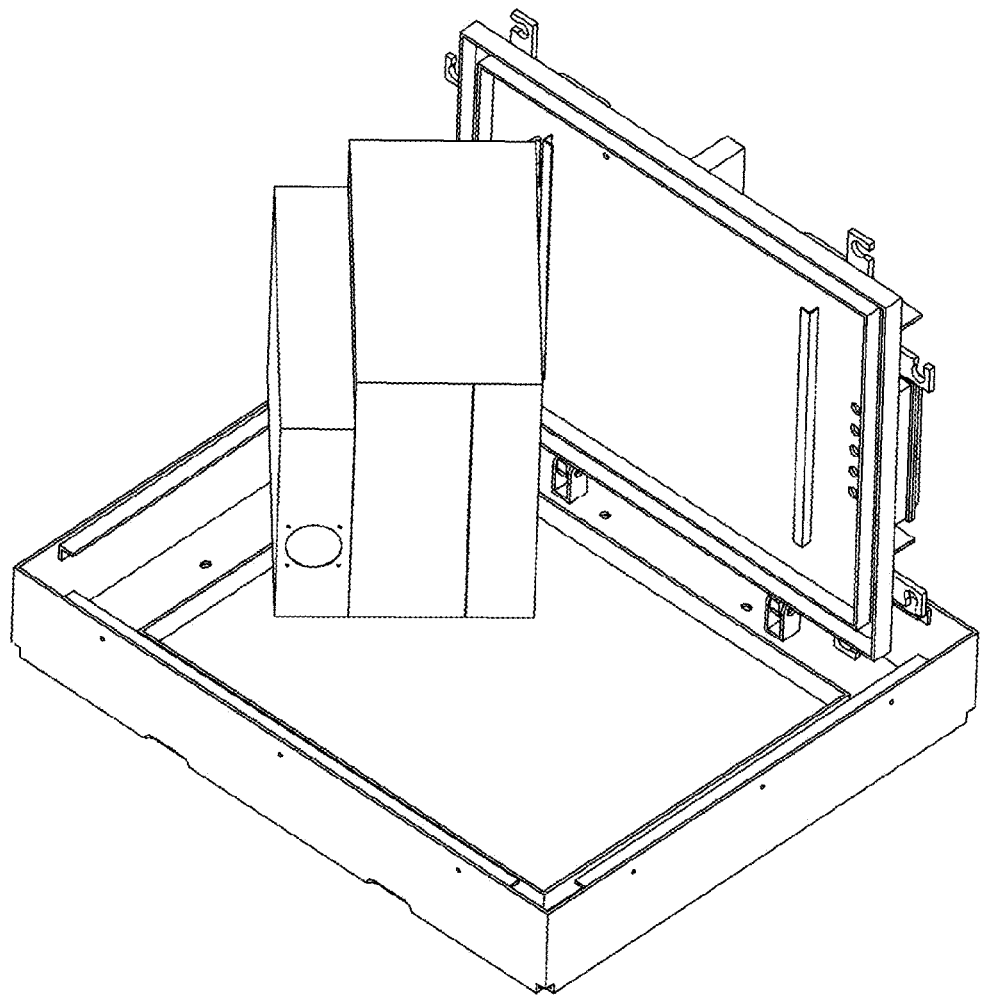
FIG. 11 is a detailed perspective view of the underground laying type electric equipment container system in which the electric equipment box 7 illustrated in FIG. 1 is rotated by about a half turn.
Figure 12:
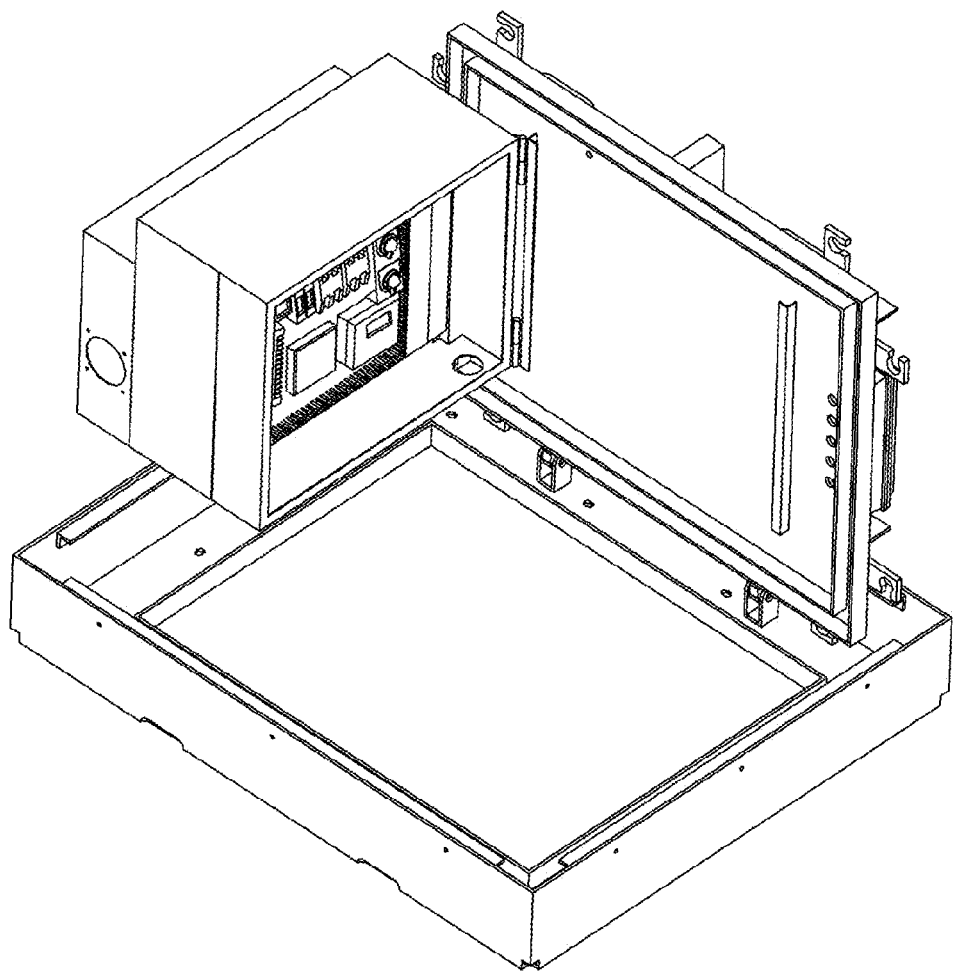
FIG. 12 is a detailed perspective view of the underground laying type electric equipment container system in which the electric equipment box 7 illustrated in FIG. 1 is completely rotated.

FIG. 8 is a detailed perspective view of the underground laying type electric equipment container system while the lower cover 5 illustrated in FIG. 1 is closed. As illustrated in FIG. 8, a container of various equipments such as equipments needed to operate the electric equipment embedded in the electric equipment box 7 may be loaded on the lower cover 5. FIG. 9 is a detailed perspective view of the underground laying type electric equipment container system in which about a half of the lower cover 5 illustrated in FIG. 1 is opened. FIG. 10 is a detailed perspective view of the underground laying type electric equipment container system while the lower cover 5 illustrated in FIG. 1 is completely opened. FIG. 11 is a detailed perspective view of the underground laying type electric equipment container system in which the electric equipment box 7 illustrated in FIG. 1 is rotated by about a half turn. FIG. 12 is a detailed perspective view of the underground laying type electric equipment container system in which the electric equipment box 7 illustrated in FIG. 1 is completely rotated. As described above, FIGS. 8 through 12 illustrate in a slide show manner how the electric equipment box 7 located in the sealed space of the buried box 1 is moved to the ground and opened according to the above-described characteristics.

Figure 13:
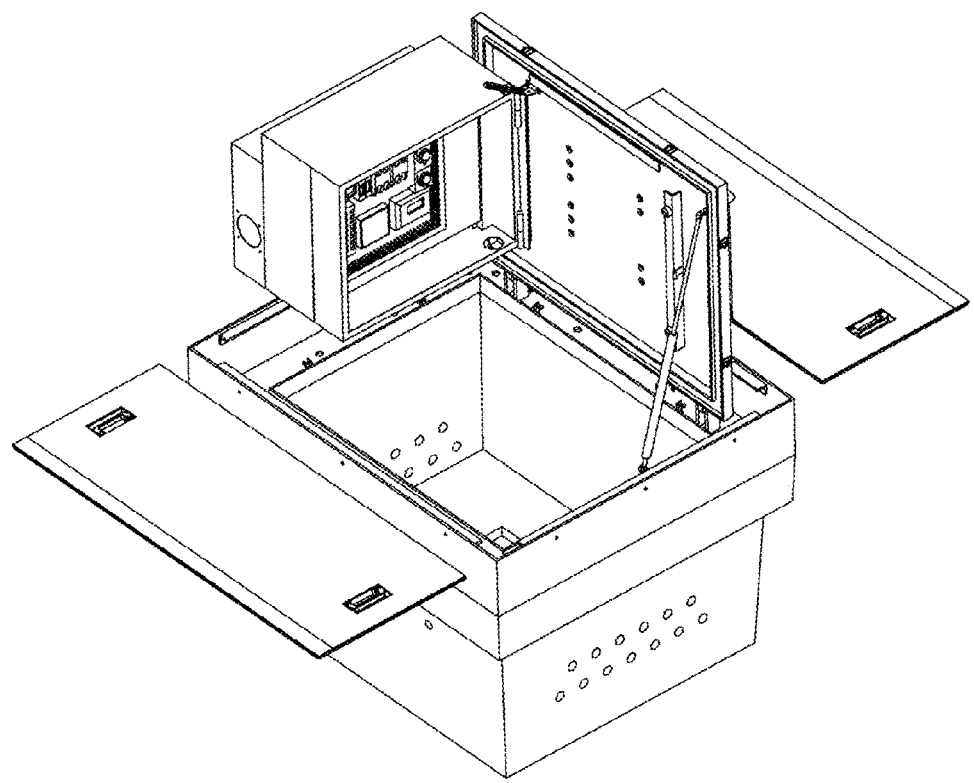
FIG. 13 is a perspective view of a modified example of the underground laying type electric equipment container system illustrated in FIG. 1.
Figure 14:
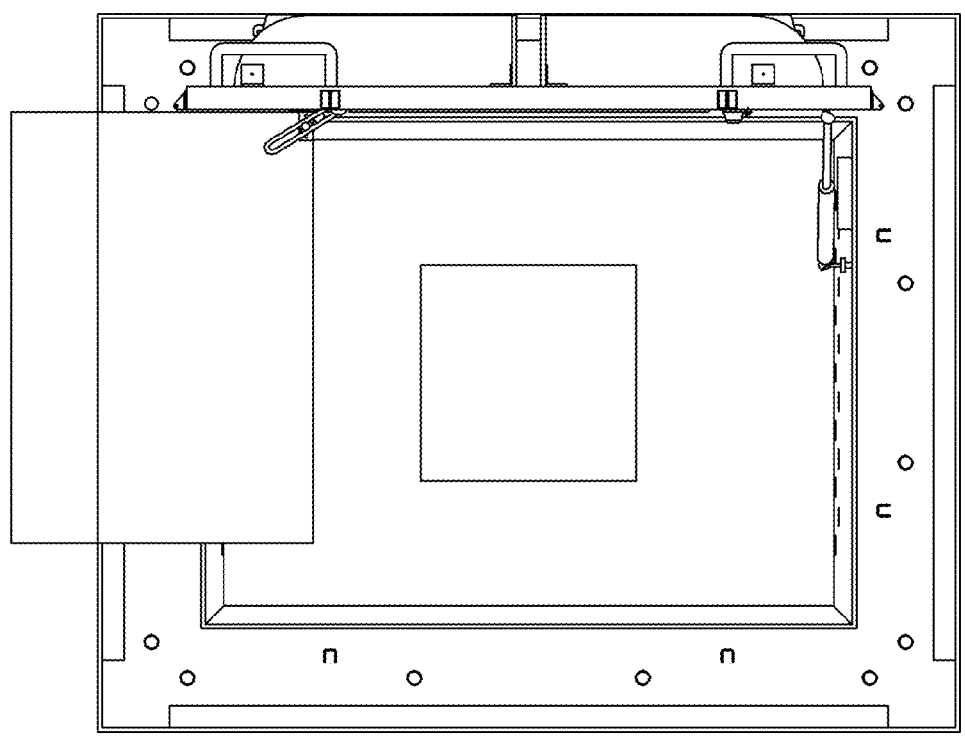
FIG. 14 is a plan view of the modified example of the underground laying type electric equipment container system illustrated in FIG. 1.
Figure 15:
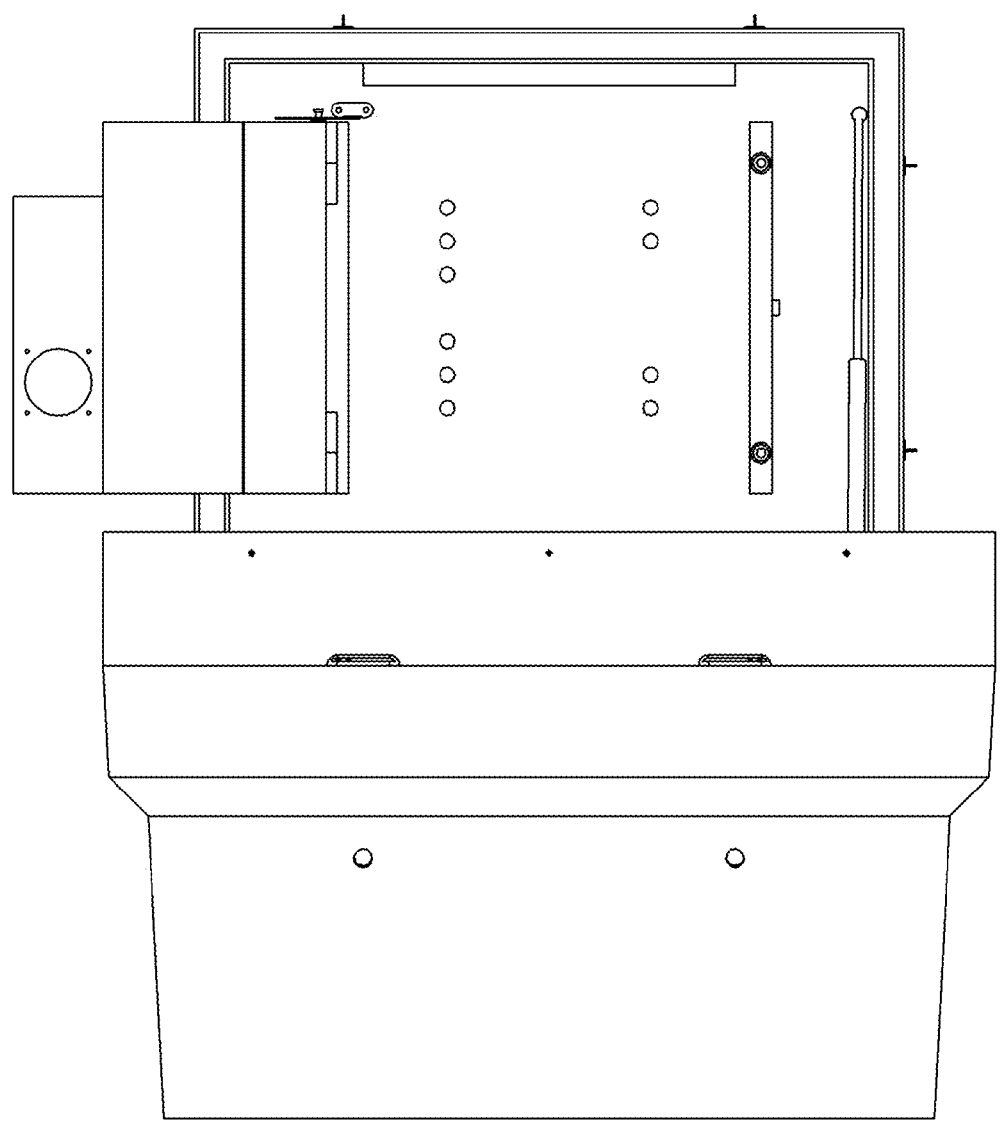
FIG. 15 is a front view of the modified example of the underground laying type electric equipment container system illustrated in FIG. 1.
Figure 16:
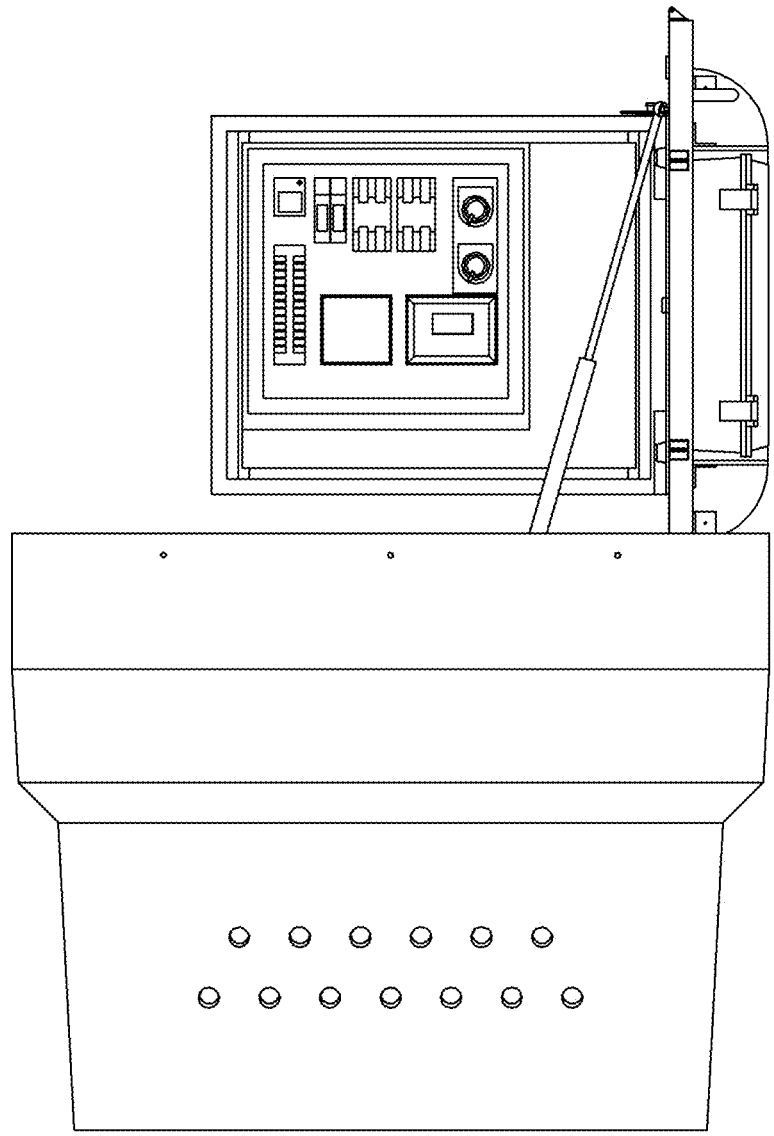
FIG. 16 is a side view of the modified example of the underground laying type electric equipment container system illustrated in FIG. 1.

FIGS. 13 through 16 illustrate a modified example of the underground laying type electric equipment container system illustrated in FIG. 1. FIG. 13 is a perspective view of the modified example of the underground laying type electric equipment container system illustrated in FIG. 1. FIG. 14 is a plan view of the modified example of the underground laying type electric equipment container system illustrated in FIG. 1. FIG. 15 is a front view of the modified example of the underground laying type electric equipment container system illustrated in FIG. 1. FIG. 16 is a side view of the modified example of the underground laying type electric equipment container system illustrated in FIG. 1. As described above, to reinforce an adhesive force between the upper portion of the vertical frame of the box holder 2 and the waterproof band 6, the weight of the lower cover 5 may be increased, and if the weight of the electric equipment is considerably high, it may be impossible to move the lower cover 5 by a human strength of the user. Due to the weight of the lower cover 5 and the electric equipment, it may be difficult to lift and rotate the lower cover 5 just by a human strength of the user. In addition, if a human strength of the user needed to lift and rotate the lower cover 5 is reduced, not only the burden for the user in regard to movement of the lower cover 5 and the electric equipment box 7 may be reduced but damages due to collision between the lower cover 5 and box holder 2 due to user's mistake may also be eliminated.

Considering these features, an assistant device may be installed between the box holder 2 and the lower cover 5 to increase a human strength of the user that acts on the lower cover 5 to rotate the lower cover 5. As the assistant device, for example, a gas spring, a gear, or a pulley may be used. Referring to FIG. 13 through 16, a gas spring is used as an assistant device that is installed between the box holder 2 and the lower cover 5. The gas spring as described above is typically used in a hood or a trunk of an automobile. The gas spring is a type of a spring that uses a compressed gas, and a high-pressure gas spring contains a large amount of energy, and this energy is used in increasing the human strength of the user. By installing the assistant device as described above between the box holder 2 and the lower cover 5, not only the burden for the user in regard to movement of the lower cover 5 and the electric equipment box 7 may be reduced but damages due to collision between the lower cover 5 and box holder 2 due to user's mistake may also be eliminated.

According to the embodiments described above, a manual underground laying type electric equipment container system provides an underground laying type electric equipment container system having a structure in which inner space of the buried box 1 that is laid underground is sealed just by a human strength of the user without a power unit and the electric equipment box 7 may be moved to the sealed inner space of the buried box 1 at the same time. As the electric equipment which has been on the ground may be manually moved into the sealed inner space of the buried box 1 that is laid underground, facilities related to the electric equipment such as electric poles may be removed from the ground, and accordingly, the appearance of the city is improved, city space may be efficiently used, and safety is ensured because the danger of falling facilities is not present. The electric equipment box 7 located in the sealed inner space of the buried box 1 may be moved out of the buried box 1 according to user's manipulation, and thus, maintenance and repair of the electric equipment is easy.

As the manual underground laying type electric container system is provided as described above, multiple devices such as a power unit and a controller of the power unit which are needed in the conventional automatic underground laying type electric equipment container system are no longer needed, and accordingly, the manufacturing costs and size of the underground laying type electric equipment container system may be significantly reduced. In addition, sealing of the buried box 1 and movement of the electric equipment box 7 are conducted just by user's rotating the lower cover 5 with respect to the coupling devices fixed to the buried box 1, as an axis of rotation, and thus, most of the danger of accidents to the user and damages to the structures according to movement of the lower cover 5 is eliminated.

Furthermore, since the electric equipment box 7 is attached to the lower surface of the lower cover 5 that seals the inner space of the buried box 1 and thus may be moved out of or into the box as a single body with the lower cover 5, the manufacturing costs and the size of the underground laying type electric equipment container system may be minimized. In addition, as the user is able to rotate the electric equipment box 7 with respect to the coupling device that is fixed to the lower cover 5, as an axis of rotation, the user may access the user interface panel of the electric equipment even when an opening surface of the user interface panel of the electric equipment is covered by the lower surface of the lower cover 5 due to the installation direction of the electric equipment embedded in the electric equipment box 7. Also, an assistant device is installed between the box holder 2 and the lower cover 5 to increase a human strength of the user that acts on the lower cover 5 to rotate the lower cover 5, and accordingly, not only the burden for the user in regard to movement of the lower cover 5 and the electric equipment box 7 may be reduced but damages due to collision between the lower cover 5 and box holder 2 due to user's mistake may also be eliminated.

While this invention has been particularly shown and described with reference to embodiments thereof, it will be understood by those of ordinary skill in the art that various changes in form and details may be made therein without departing from the spirit and scope of the invention as defined by the appended claims. The preferred embodiments should be considered in a descriptive sense only and not for purposes of limitation. Therefore, the scope of the invention is defined not by the detailed description of the invention but by the appended claims, and all differences within the scope will be construed as being included in the present invention.

The invention claimed is:

1. An underground laid electric equipment container system, comprising:
    a buried box that is laid underground in the form of a manhole such that omni-directional lateral sides and an underside of the buried box are sealed and a portion of an upper surface of the buried box is opened;
    a box holder that comprises a horizontal frame that is coupled to the upper surface of the buried box in an sealed state and an inner vertical frame that is upwardly bent from an inner edge of the horizontal frame;
    a cover, to which a waterproof band covering the entire upper portion of the inner vertical frame is attached, wherein coupling devices with an upper surface of the horizontal fame that allow adhesion between the upper portion of the inner vertical frame and the waterproof band are installed on the cover; and
    an electric equipment box that is disposed in sealed inner space of the buried box that is formed as the upper portion of the inner vertical frame and the waterproof band are adhered to each other by user's manipulation.

2. The underground laying type electric equipment container system of claim 1, wherein some of the coupling devices of the upper surface of the horizontal frame and the cover are coupled or separated by user's manipulation, and while some of the coupling devices are separated, the cover is rotatable with respect to other coupling devices, as an axis of rotation, from among the coupling devices, by user's manipulation.

3. The underground laying type electric equipment container system of claim 2, wherein the sealed inner space of the buried box is formed as the waterproof band is adhered to an upper portion of the horizontal frame by rotation of the cover according to user's manipulation.

4. The underground laying type electric equipment container system of claim 1, wherein the electric equipment box is attached to a lower surface of the cover and is moved as a single body with the cover.

5. The underground laying type electric equipment container system of claim 4, wherein some of the coupling devices of the upper surface of the horizontal frame and the cover are coupled or separated by user's manipulation, and while some of the coupling devices are separated, the cover is rotatable with respect to other coupling devices from among the coupling devices, as an axis of rotation, by user's manipulation, and
    the electric equipment box is moved out of the buried box as the cover is separated from the upper surface of the inner vertical frame of the box holder by rotation of the cover according to user's manipulation, and at the same time, the electric equipment box rotates as a single body with the cover.

6. The underground laying type electric equipment container system of claim 4, wherein an electric equipment including at least one component whose performance changes according to various directions of Earth's gravitational force is embedded in the electric equipment box, and a user interface panel of the electric equipment is accessible by opening an upper surface of the electric equipment box that is temporarily attached to the lower surface of the cover.

7. The underground laying type electric equipment container system of claim 6, wherein some of the coupling devices of the electric equipment box and the cover are coupled or separated by user's manipulation, and while some of the coupling devices are separated, the electric equipment box is rotatable with respect to other coupling devices from among the coupling devices of the electric equipment box and the cover, as an axis of rotation, by user's manipulation, and the upper surface of the electric equipment box is separated from the lower surface of the cover by rotation of the electric equipment box according to user's manipulation, and at the same time, the upper surface of the electric equipment box is opened.

8. The underground laying type electric equipment container system of claim 2, wherein an assistant device is installed between the box holder and the cover to increase a human strength of the user that acts on the cover to rotate the cover.

9. The underground laying type electric equipment container system of claim 8, wherein the assistant device is a gas spring.

10. The underground laying type electric equipment container system of claim 1, wherein the box holder further comprises an outer vertical frame that is upwardly bent from an outer edge of the horizontal frame, wherein the underground laying type electric equipment container system further comprises:

a support that is attached to an inner portion of the outer vertical frame at a predetermined depth from an upper portion of the outer vertical frame; and an upper cover that is mounted to the support.

* * * * *